United States Patent
Bayindir et al.

(10) Patent No.: US 7,295,734 B2
(45) Date of Patent: Nov. 13, 2007

(54) OPTOELECTRONIC FIBER CODRAWN FROM CONDUCTING, SEMICONDUCTING, AND INSULATING MATERIALS

(75) Inventors: Mehmet Bayindir, Somerville, MA (US); Fabien Sorin, Cambridge, MA (US); Dursen Saygin Hinczewski, Cambridge, MA (US); Shandon D. Hart, Maplewood, MN (US); Yoel Fink, Brookline, MA (US); John D. Joannopoulos, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/890,948

(22) Filed: Jul. 14, 2004

(65) Prior Publication Data

US 2005/0053345 A1 Mar. 10, 2005

Related U.S. Application Data

(60) Provisional application No. 60/487,125, filed on Jul. 14, 2003, provisional application No. 60/539,470, filed on Jan. 27, 2004.

(51) Int. Cl.
*G02B 6/44* (2006.01)
*G02F 1/035* (2006.01)
*G02F 1/295* (2006.01)

(52) U.S. Cl. ............ 385/101; 385/100; 385/127; 385/128

(58) Field of Classification Search ............ 385/101, 385/104, 105, 123
See application file for complete search history.

(56) References Cited

U.S. PATENT DOCUMENTS 4,890,898 A 1/1990 Bentley et al.
5,042,903 A * 8/1991 Jakubowski ............... 385/101
5,557,698 A * 9/1996 Gareis et al. .............. 385/101
5,815,627 A 9/1998 Harrington
6,078,707 A 6/2000 Yamamoto et al.
6,110,592 A * 8/2000 Grizante et al. ............ 428/375
6,239,422 B1 5/2001 Vang et al.
6,317,531 B1 * 11/2001 Chen et al. ................. 385/17
6,418,248 B1 7/2002 Hayes
6,573,813 B1 6/2003 Joannopoulos et al.
6,756,576 B1 6/2004 McElroy et al.

(Continued)

FOREIGN PATENT DOCUMENTS

WO   WO 2006/014360   2/2000

OTHER PUBLICATIONS

Kanamori et al. "Chalcogenide Glass Fibers for Mid-Infrared Transmission." Journal of Lightwave Technology, vol. LT-2, No. 5, Oct. 1984.*

(Continued)

*Primary Examiner*—Michelle Connelly-Cushwa
*Assistant Examiner*—Rhonda S. Peace
(74) *Attorney, Agent, or Firm*—Theresa A. Lober

(57) ABSTRACT

The invention provides techniques for drawing fibers that include conducting, semiconducting, and insulating materials in intimate contact and prescribed geometries. The resulting fiber exhibits engineered electrical and optical functionalities along extended fiber lengths. The invention provides corresponding processes for producing such fibers, including assembling a fiber preform of a plurality of distinct materials, e.g., of conducting, semiconducting, and insulating materials, and drawing the preform into a fiber.

51 Claims, 7 Drawing Sheets

U.S. PATENT DOCUMENTS

| | | | |
|---|---|---|---|
| 6,856,733 | B2 | 2/2005 | Zheng |
| 6,984,598 | B1* | 1/2006 | Hilton, II .................... 501/37 |
| 7,054,513 | B2 | 5/2006 | Herz et al. |
| 2002/0081714 | A1 | 6/2002 | Jain et al. |
| 2002/0185968 | A1 | 12/2002 | Ohkubo |
| 2003/0049003 | A1 | 3/2003 | Ahmad et al. |
| 2004/0081412 | A1* | 4/2004 | Cocchini et al. ............ 385/104 |
| 2004/0179796 | A1* | 9/2004 | Jakobsen et al. ........... 385/123 |
| 2004/0179806 | A1 | 9/2004 | Block et al. |
| 2004/0258376 | A1* | 12/2004 | Fokine et al. ............... 385/123 |
| 2005/0024512 | A1 | 2/2005 | Moini et al. |
| 2005/0040374 | A1 | 2/2005 | Chittibabu et al. |
| 2005/0081913 | A1 | 4/2005 | Ebbesen et al. |
| 2005/0157997 | A1* | 7/2005 | McCarthy et al. .......... 385/123 |
| 2006/0201206 | A1* | 9/2006 | Benoit et al. ................. 65/389 |

OTHER PUBLICATIONS

Monro et al. "Chalcogenide Holey Fibers." Electronic Letters Online, vol. 36, No. 24, Nov. 23, 2000.*

Croitoru et al. "Mechanical and Optical Properties of the Chalcogenide Glass System As2Se(3-x)Tex" Journal of Lioghtwave Technology, vol. LT-5, No. 11, Nov. 1987.*

Bayindir et al. "Novel Optoelectronic Fibers Codrawn from Conducting, Semiconducting, and Insulating Materials." 2005 Conference on Lasers & Electro-Optics (CLEO). pp. 1686-1687.*

Swager, Timothy. "Polymer Light-Emitting Devices: Light from Insulated Organic Wires." Nature Materials. vol. 1, Nov. 2002. pp. 151-152.*

El-Sayed, "Far-infrared Studies of the Amorphous $Sb_xGe_{28-x}Se_{72}$ Glassy Semiconductor," Semiconductor Science and Technology, vol. 18, pp. 337-341, Mar. 3, 2003.

Lide, Handbook of Chemistry and Physics, 79th Edition, CRC Press, New York, NY, p. 12-127, 1998.

Patent Abstracts of Japan, vol. 005, No. 154, P-082, Sep. 29, 1981.

Szukwei et al., "Crystallization behaviour of chalcogenide glasses containing Sn," Jnl of Non-Crystalline Solids, vol. 112, Nos. 1/3, pp. 204-206, Oct. 1, 1989.

Miyagi et al., "Fabrication of germanium-coated nickel hollow waveguides for infrared transmission," Appl. Phys. Lett., V. 43, N. 5, pp. 430-432, Sep. 1, 1983.

Matsuura et al., "Hollow glass waveguides with three-layer dielectric coating fabricated by chemical vapor deposition," J. Opt. Soc. Am. A, V. 14, N. 6, pp. 1255-1259, Jun. 1997.

Van Eijkelenborg et al., "Recent progress in microstructured polymer optical fibre fabrication and characterisation," Optical Fiber Tech., V. 9, pp. 199-209, 2003.

Large et al., "Microstructured optical fibres: why use polymers?" Proc. 29th European Conf. on Opt. Comm. (ECOC '03 Rimini) 2003.

Bayindir et al., "Metal-insulator-semiconductor optoelectronic fibres," Nature, V. 431, pp. 826-829, Oct. 14, 2004.

* cited by examiner

OPTOELECTRONIC FIBER CODRAWN FROM CONDUCTING, SEMICONDUCTING, AND INSULATING MATERIALS

This application claims the benefit of U.S. Provisional Application No. 60/487,125, filed Jul. 14, 2003, and U.S. Provisional Application No. 60/539,470, filed Jan. 27, 2004, the entirety of both of which are hereby incorporated by reference.

STATEMENT REGARDING FEDERALLY SPONSORED RESEARCH

This invention was made with Government support under Contract No. DAAD19-01-0647, awarded by DARPA, under Contract No. ECS-0123460, awarded by the NSF, under Contract No. DMR 02-13282 awarded by the NSF, under contract N00014-02-1-0717 awarded by ONR, under Contract No. Y77011 awarded by AFOSR, and under Contract No. DE-FG02-99ER45778 awarded by DOE. The Government has certain rights in the invention.

BACKGROUND OF INVENTION

This invention relates generally to optical fibers, optical devices, electronic devices and optoelectronic devices and in particular relates to fiber materials selection, fiber structure design, and fiber drawing techniques for producing a fiber with desired functionality.

A combination of conducting, semiconducting, and insulating materials in well-defined geometries, prescribed micro- and nano-scale dimensions, and with intimate interfaces is essential for the realization of virtually all modern electronic and optoelectronic devices. Historically, such devices are fabricated using a variety of elaborate microfabrication technologies that employ wafer-based processing. The many wafer-based processing techniques currently available enable the combination of certain conducting, semiconducting, and insulating materials in small feature sizes and high device packing densities. But in general, microfabrication techniques are restricted to planar geometries and planar conformality and limited device extent and/or materials coverage area. Microfabricated devices and systems also in general require packaging and typically necessitate very large capital expenditures.

Conversely, modern preform-based optical fiber production techniques can yield extended lengths of material and enable well-controlled geometries and transport characteristics over such extended lengths. In further contrast to wafer-based processing, fiber preform drawing techniques are in general less costly and less complicated. But in general, preform-based optical fiber production has been restricted to large fiber feature dimensions and a relatively small class of dielectric materials developed primarily for enabling optical transmission. A wide range of applications therefore remain to be addressed due to the limitations of both conventional fiber preform-based drawing technologies and conventional microfabrication technologies.

SUMMARY OF THE INVENTION

The invention provides techniques for drawing fibers that include conducting, semiconducting, and insulating materials in intimate contact and prescribed geometries. The resulting fiber exhibits engineered electrical and optical functionalities along extended fiber lengths. The invention provides corresponding processes for producing such fibers, including assembling a fiber preform of a plurality of distinct materials, e.g., of conducting, semiconducting, and insulating materials, and drawing the preform into a fiber. The ability of the processes of the invention to intimately interface materials with widely disparate electrical conductivities and refractive indices, achieve submicron feature sizes, and realize arbitrary lateral geometries over extended lengths enables the delivery of electronic, photonic and optoelectronic device functionalities at optical fiber length scales and cost.

Other features and advantages of the invention will be apparent from the following description and accompanying figures, and from the claims.

DETAILED DESCRIPTION OF THE INVENTION

Figure 1A:
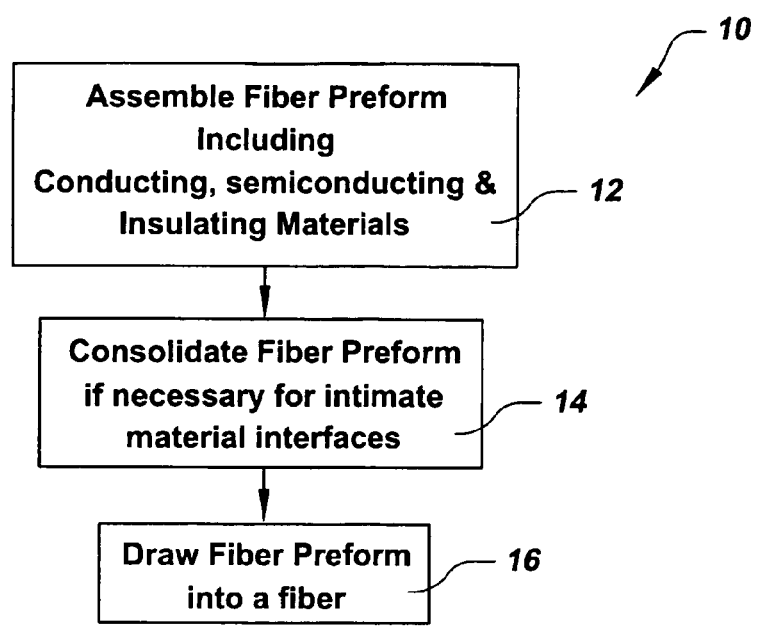
FIGS. 1A-1B are flow charts of processing steps of the fiber preform assembly and draw processes provided by the invention.

Fibers produced in accordance with the invention are three-dimensional, unsupported physical objects for which one dimension, defined as the longitudinal dimension, is substantially larger than the other two dimensions, defined as the cross sectional dimensions, and are fabricated by, e.g., the production sequence 10 outlined in the flow chart of FIG. 1A. In a first example sequence step 12, conducting, semiconducting, and insulating materials are assembled into a fiber preform. The preform includes the selected materials arranged in a macroscopic geometric configuration corresponding to, though not necessarily equivalent to, the desired geometry of the fiber. The preform is characterized by a ratio of longitudinal to cross sectional dimensions that is typically between about 2 and about 100. Once assembled, the preform can be consolidated 14 in a next process step. The consolidation process, carried out under selected temperature and pressure conditions as described below, is employed when necessary for producing intimate material interfaces in the preform and to ensure element shape integrity throughout the draw process. The preform is then drawn 16 into a fiber that preserves the cross sectional geometric configuration of the macroscopic preform while reducing preform feature sizes to smaller scales and producing extended fiber lengths of uniform cross section.

Figure 2:
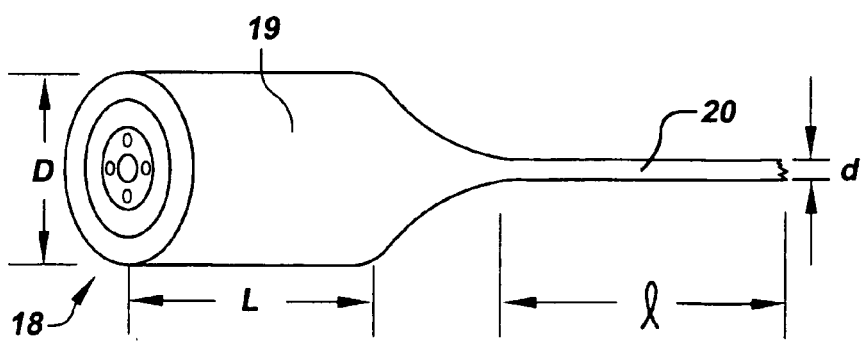
FIG. 2 is a schematic representation of a fiber preform and the corresponding fiber produced by drawing the preform in accordance with the invention.

These striking dimensional shifts produced by the fiber drawing process are schematically illustrated in FIG. 2. A macroscopic assembly 18 of conducting, semiconducting, and insulating materials is arranged as a preform 19 having a diameter, D on the order of about 10 mm to about 100 mm and a length, L, on the order of centimeters, e.g., less than 100 cm or less than 50 cm. The structured preform 19 is then subjected to heating and deformation under fiber drawing conditions to produce a fiber 20.

The resulting fiber 20 has a length, l, on the order of meters, e.g., 10 m, 20 m, 50 m, 100 m, or longer, and a diameter, d, on the order of between about 50 µm and about 2000 µm, resulting in a longitudinal-to-cross sectional ratio that can be above 1000, a length that can be more than 100 times greater than that of the preform, and a diameter that can be 10 times less than the diameter of the preform. Within the fiber, feature sizes on the order of 10's of nanometers can be produced. The fiber drawing process of the invention thereby preserves the preform's element organization along its length while forming intimate material interfaces and reducing element sizes to the micro- and nano-scale along extended fiber lengths.

As a result, the invention enables the production of extended-length fiber for combined optical and electrical transmission, as well as micro-scale microelectronic and optoelectronic device operation along the fiber axial length and/or across the fiber's cross-section, without employing wafer based microfabrication techniques. Macroscopic assembly of a preform is in general convenient and does not require exotic process techniques or equipment. The invention is not limited to a particular preform configuration or preform assembly technique. Any preform configuration and preform assembly techniques that employ conducting, semiconducting, and insulating materials that are compatible for co-drawing, as explained below, can be utilized.

Figure 3A:
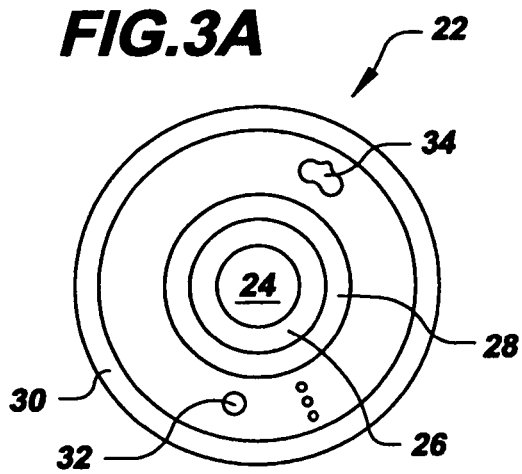
FIGS. 3A-3G are schematic cross-sectional views of example fiber geometries enabled by the processes of the invention.

FIG. 3A is a cross-sectional view of a first example fiber configuration 22 that can be produced in accordance with the invention. While this example fiber is shown having a circular cross section, such is not required; any suitable cross sectional geometry, e.g., rectangular, can be employed for the fiber as well as the elements included in the cross-sectional fiber arrangement. In the example fiber there is provided a fiber core region 24 around which are provided a number of layers 26, 28 ranging in number from one to any selected number, with a final layer 30 at the surface. The fiber core region 24 can be provided as an air core or as a solid of conducting, semiconducting, or insulating material. For example, the core region can be provided as a semiconducting or insulating material for optical transmission, with one or more outer layers 26, 28 provided as conducting materials for electrical transmission. One or more outer layers can also or alternatively be provided as semiconducting and insulating, for optical transmission, electrooptical device operation, and for electrical and optical isolation, and the core region, in concert with one or more outer layers, can provide optoelectronic device operation.

Also as shown in FIG. 3A, there can be included in the fiber 22 one or more strands 32, and other geometric elements 34 of conducting, semiconducting, or insulating materials provided along the axis of the fiber. Such elements can be incorporated in one or more layers of the fiber and can be arranged around the fiber circumference. This arrangement can be extended as shown in the example configuration 37 shown in FIG. 3B, with an array of strands 36 provided around a portion or the entire circumference of the fiber, and arranged in a desired configuration with other fiber elements, e.g., surrounding a core region 38, and optionally including one or more layers 39, 40 surrounding the core and the strands 36. The invention is not limited to a particular configuration of strands or other elements. As shown in the example fiber 31 of FIG. 3C, a multi-dimensional array of strands 35 can be provided about a core region 33 or other selected preform element. Each of the strands can be provided as conducting, semiconducting, or insulating materials.

Figure 3B:
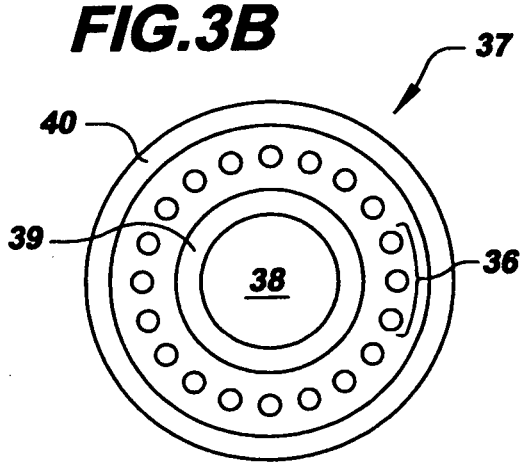
Figure 3C:
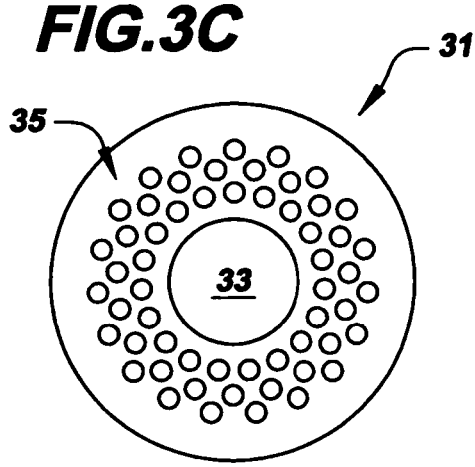
Figure 3D:
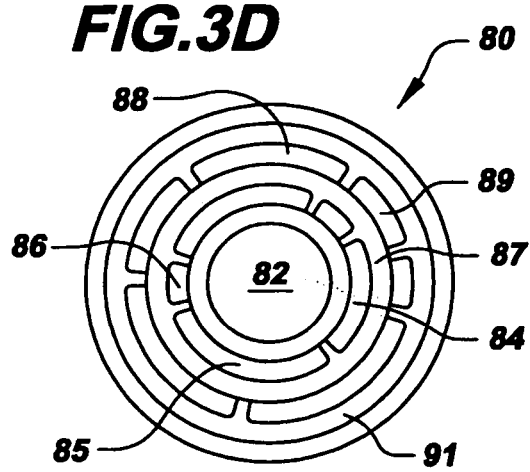

As shown in the example fiber configuration 80 of FIG. 3D, the material layers provided about a core region 82 or other fiber geometry can be discontinuous, i.e., multiple distinct layer regions 84, 85, 86, 88, 89 can be provided as an alternative to a continuous layer. Such distinct layer regions can be provided adjacent to continuous layer regions 87, 91, and can be provided at multiple locations across the fiber cross section, and can be provided as any of conducting, semiconducting, or insulating materials.

Figure 3E:
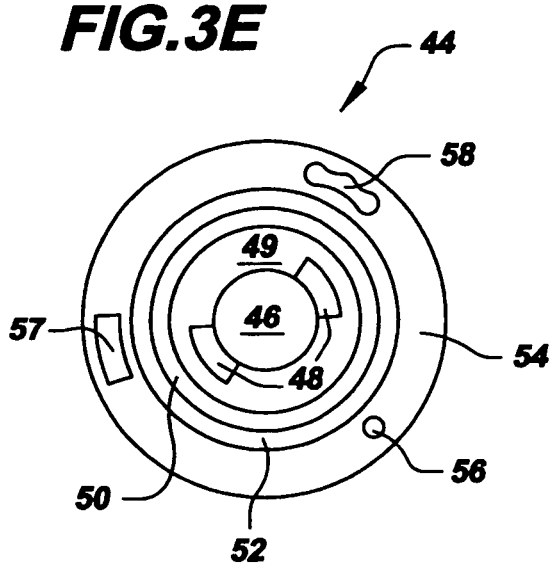

The invention contemplates fiber geometries in which arrangements of conducting, semiconducting, and insulating elements are provided in intimate interfacial contact that enables optoelectronic device operation. For example, as shown in FIG. 3E, there can be provided a fiber configuration 44 in which a core region 46 is adjacent to and in contact with one or more regions that can be provided as conducting electrodes 48. While the illustrated example shows two electrodes, it is to be recognized that any number of electrodes can be included. In this example, discussed in detail below, the core region 46 can be provided of a material, such as a insulator or semiconductor, that is selected for interaction with and/or control by the adjacent electrodes 48. The core region 46 and adjacent regions 48 thereby are provided as optoelectronic device elements within the fiber.

The region 49 directly surrounding the electrodes can be provided as a suitable material, e.g., an insulating material. Indeed, the various preform regions and elements 46, 48, 49 can be provided of any of conducting, semiconducting, and insulating materials. As shown in FIG. 3E, additional layers of material 50, 52, 54 can be included around the core region and electrodes. Additionally, one or more strands 56 of material can be incorporated in one or more of the layers, and one or more electrodes 57 and/or other elements 58 can similarly be incorporated in the layers.

Figure 3F:
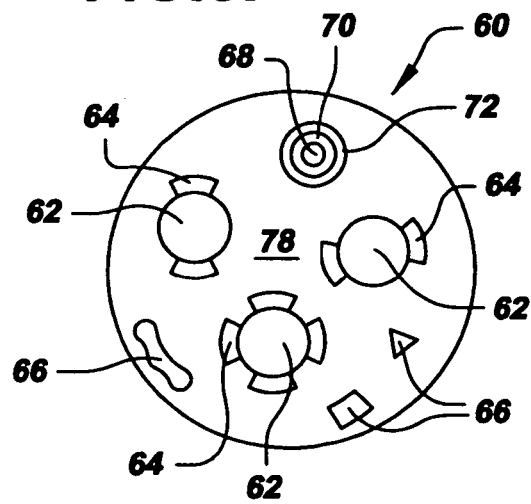

Turning to FIG. 3F, in a further example fiber configuration 60 provided by the invention, multiple cores 62 and/or strands and other elements 66, 68, of arbitrary geometry, can be included in the fiber in a desired arrangement across the fiber cross-section. Multiple core regions 62 and/or strands can be provided with adjacent regions 64, e.g., electrodes, in any desired arrangement, e.g., as one or more pairs of electrodes. The fiber strands 68 as well as the core regions can also be individually axially surrounded by additional material layers 70, 72 or by other fiber elements. Finally, if desired, the fiber can include one or more material layers that surround a material region 78 in which the various elements are provided. No particular symmetry is required between the various cores, strands, and other elements included in the fiber.

The examples of FIGS. 3A-3F demonstrate several particular advantages of the fiber and fiber drawing processes of the invention. Conducting, semiconducting, and insulating materials can be disposed in selected configurations that enable the production of optical and electronic functional elements, e.g., optoelectronic device elements, within the fiber cross section. The fiber can include hollow regions or can be characterized by an all-solid cross section, i.e., a cross section having no hollow regions. The fiber elements do not need to display the symmetry of the fiber outer perimeter or if hollow, the fiber inner perimeter. The fiber can further be characterized by cylindrical asymmetry. The fiber can include elements that have a perimeter that is a closed loop which does not contain a characteristic center of a cross section of the fiber.

There is no requirement as to the ordering of materials within the fiber of the invention, with the caveat that metal regions be geometrically confined in the manner described below. Having no such ordering requirement, the fiber of the invention can provide one or more material interfaces and/or material composition discontinuities along a path, around a cross section of the fiber, that conforms to a fiber perimeter. In other words, along a path around the fiber cross section that is a fixed distance from the fiber periphery at all points of the path, material interfaces and/or material composition discontinuities can be provided. For specific geometries, such a path can be considered a circumferential path. This condition enables a wide range of fiber geometries, including, e.g., conducting electrodes at locations of the fiber cross section, across which can be sustained an applied voltage.

The fiber configuration of FIG. 3F can be adapted, however, with a selected symmetry and fiber element configuration. For example, as shown in the fiber configuration 65 of FIG. 3G, fiber elements can be arranged with a particular symmetry, e.g., in a two-dimensional sub-fiber array that can incorporate previously drawn fiber elements. In the example fiber of FIG. 3G, a number, e.g., 1000, of individually drawn sub-fibers 67, each having a selected cross section geometry that can be substantially similar or dissimilar from the other sub-fibers, are arranged as a hybrid fiber. In the example shown, each sub-fiber 67 in the hybrid fiber 65 is provided with a core region 62 and electrodes 64 adjacent to and in contact with the core region, and having an outer region 71 about the electrodes and core region. It is to be recognized that any geometry can be selected for each individual sub-fiber in the hybrid fiber, however. Additionally, the functionality of each sub-fiber in the hybrid fiber array can be selected to complement that of the other sub-fibers, and elements of the sub-fibers can be electrically or otherwise interconnected to form an integrated circuit hybrid fiber in which devices are provided across the various sub-fibers in the array.

The example fibers of FIGS. 3A-3G are provided to demonstrate the wide range of fiber configurations contemplated by the invention. Features shown in one or more of the example fibers can be selectively included in a customized fiber configuration that provides desired functionalities of optical transmission, electrical transmission, and/or optoelectronic device operation. Because the fiber configuration enables isolated arrangement of selected materials as well as intimate contact between materials, optical and electrical transmission can occur simultaneously yet separately, and in parallel with optoelectronic device operation. The materials selected for various fiber elements can be customized for a given application, with conductor-semiconductor, conductor-insulator, and semiconductor-insulator interfaces occurring throughout the fiber cross section and around the fiber circumference.

The direction of electron transmission, if such is accommodated by the fiber geometry, can coincide with or be counter to a direction of photon transmission through the fiber, if such is also accommodated by the fiber geometry. In general, the direction of electron and photon transmission can be longitudinal, i.e., along the fiber axial length, and/or radial, from a center region radially outward or from an outward region radially inward. The thicknesses of the materials included in a given fiber configuration are therefore preferably selected based on the particular fiber application and the desired direction of electronic and photonic transmission, as discussed in detail below.

Whatever fiber configuration is selected, in accordance with the invention the configuration includes conducting, semiconducting, and insulating materials arranged as layers, regions, and/or elements, with selected material interfaces, that enable desired optical and/or electrical functionality for the fiber. The conductivity of each material can be selected based on the functionality specified for that material. For example, suitable conducting materials can be characterized by a conductivity greater than about $10^2$ $1/\Omega \cdot cm$; suitable semiconducting materials can be characterized by, a conductivity less than about $10^2$ $1/\Omega \cdot cm$ but greater than about $10^{-12}$ $1/\Omega \cdot cm$; and insulating materials can be characterized by a conductivity less than $10^{-12}$ $1/\Omega \cdot cm$. This example characterization of materials highlights the particular advantage of the invention in its ability to intimately incorporate materials having over ten orders of magnitude disparity in conductivity. It is to be recognized that there does not exist a well-defined, i.e., absolute, boundary in conductivity values between conductors, semiconductors, and insulators. These example values are provided as a general aid in characterizing suitable conducting, semiconducting and insulating materials for optical and electrical fiber functionality.

As explained above, the various selected materials are first assembled in a macroscopic preform and then drawn to a final fiber geometry. The thermal deformation conditions inherent in the fiber drawing process require that the conducting, semiconducting, and insulating materials selected for a given fiber configuration be compatible for co-drawing.

For clarity of discussion, it is convenient to first describe the properties of compatible semiconductor and insulating materials to be co-drawn in accordance with the invention. In general, it is recognized that materials which are amorphous and glassy are particularly well suited to be drawn from a preform into a fiber structure. The term amorphous here refers to a material morphology that is a continuous atomic network in which there is no repeating unit cell or crystalline order; a glassy material typically is not easily crystallized at high processing temperatures. For many applications, it can be preferred to select semiconducting and insulating fiber materials that are glassy to enable fiber drawing at a reasonable speed while self-maintaining structural integrity and regularity. Such can be achieved with glassy materials because the viscosity of a glassy material varies quasi-continuously between solid and liquid states, in contrast to a crystalline material. By employing a glassy material, it is ensured that the fiber structure will remain amorphous, i.e., not crystallize, when cycled through softening and drawing temperatures.

Considering the viscosities of candidate glassy semiconducting and insulating materials, suitable materials for co-drawing are those having compatible viscosities at the fiber drawing temperatures of interest. More specifically, the materials should both be above their respective softening points at an overlapping draw temperature to enable their co-drawing. Precise viscosity matching between fiber materials is not required; specifically, the materials need not have the same viscosity at the draw temperature, but rather all should flow at that common temperature. It is further understood that for some material combinations, high viscosity in one or more materials that comprise the majority of the volume of the fiber preform is sufficient to enable structural integrity of all co-drawn materials. Suitable materials additionally are preferably characterized by good surface adhesion and wetting in the viscous and solid states without cracking even when subjected to thermal quenching.

There have been identified in accordance with the invention a class of insulating materials, namely, amorphous thermoplastic polymeric insulating materials, that are particularly well-suited to the fiber co-drawing process of the invention. High glass-transition-temperature polymeric insulators are an example of such; a wide variety of amorphous high glass-transition-temperature polymer materials are available and can be processed with a range of techniques to form various material configurations that are characterized by excellent mechanical toughness. Examples of high glass-transition-temperature polymers that can be employed include poly-ether imide (PEI), poly-sulfone (PS), poly-ether ether ketone (PEEK), and poly-ether sulfone (PES).

There also can be employed as an insulating material liquid crystal polymers (LCP's), low glass transition polymers such as poly-methyl methacrylate (PMMA), polycarbonate (PC), poly-ethylene (PE) and other such thermoplastic polymers. Poly-tetrafluoroethylene (PTFE or Teflon™) and other fluorinated polymers or copolymers can also be employed in configurations in which their characteristically poor surface adhesion properties can be accommodated. While it is preferred that amorphous polymer materials be employed, it is also recognized that some semicrystalline polymers, e.g., branched PTFE, can be employed. A necessary condition for any suitable polymeric material is that there exist a fiber draw temperature at which the polymer can be drawn into a fiber at a reasonable speed, e.g., greater than about 1 mm/minute, without decomposition.

Considering candidate semiconductor materials for the fiber co-drawing process of the invention, amorphous semiconductors are preferred, given their low glass transition temperatures and stability with respect to oxidation. Amorphous semiconductors are also preferred for their good wetting properties, defined by the contact angle between the semiconductor and polymer materials at the draw temperature; a contact angle of less than about 150 degrees can be preferred. Further, amorphous semiconductors generally are characterized by a viscosity value that is similar to that of the polymers described above at polymer draw temperatures. Both organic semiconductors, such as PPV, or poly thiophene, as well as inorganic semiconducting materials can be employed.

The class of semiconducting chalcogenide glasses are particularly well-suited to the co-drawn process of the invention. Chalcogenides are high-index inorganic glasses that contain one or more of the chalcogen elements of sulfur, selenium, and tellurium. In addition to the chalcogen element, chalcogenide glasses can include one or more of the following elements: boron, aluminum, silicon, phosphorus, sulfur, gallium, germanium, arsenic, indium, tin, antimony, lithium, thallium, lead, bismuth, cadmium, lanthanum, and the halides flourin, chlorine, bromide, and iodine. There is a very wide variety of different compositions within the family of chalcogenide glasses and thus the properties of a given conposition of $(As_{40}Se_{60})_{1-x}Sn_x$ can be employed to obtain a desired characteristic.

For many applications, the semiconducting material is best selected based on its material characteristics for enabling photonic conduction and optoelectronic device operation. For example, the amorphous semiconducting material can be compositionally tailored to achieve desired optical, thermal, and/or mechanical properties. In one example scenario, the semiconducting material is selected in combination with the insulating material to produce a multilayer photonic bandgap structure for conduction of photons through a hollow fiber core around which are provided alternating semiconducting and insulating layers. Such a configuration is described in U.S. patent application Ser. No. 10/733,873, entitled "Fiber Waveguides and Methods of Making Same," filed Dec. 10, 2003, now U.S. Patent Application Publication US20040223715A1, published Nov. 11, 2004, the entire contents of which are hereby incorporated by reference. In this example, chalcogenide semiconducting materials such as $As_2Se_3$; $(As_2Se_3)_xM_{1-x}$, where M is In, Sn, or Bi; $(As_2Se_3)_{1-x}Sn_x$; As—Se—Te—Sn, or other chalcogenide materials are employed with PES, PEI, or other suitable amorphous polymer to produce the desired bandgap structure. It is to be recognized that a wide range of polymers can be paired for co-drawing with a chalcogenide material; e.g., both high and low glass-transition-temperature polymers can be employed in conjunction with low glass-transition-temperature chalcogenide glasses.

The conducting material to be employed in the fiber of the invention is selected based on its compatibility for co-drawing with the selected semiconducting and insulating materials. At a selected fiber draw temperature, the selected conducting material should be molten or sufficiently ductile to enable thermal deformation. For many applications, it can be preferred to employ a conducting material having a melting temperature that is below a desired fiber draw temperature. It additionally is preferred that the conducting material sufficiently wet the surfaces of the semiconductor and insulating materials such that the contact angle between the conducting material and these materials is less than about 150 degrees, at the fiber draw temperature, for the case of a bare-surfaced conducting material, without inclusion of an adhesion promotor.

Given a selection of a high glass-transition-temperature polymeric insulating material and a chalcogenide semiconducting material, a low melting-temperature metal or metal alloy can be a preferable conducting material selection. For example, tin, indium, bismuth, cadmium, lithium, or other low melting-temperature metal is particularly well suited for the material trio, as well as Sn-based or other selected alloys. In addition, a selected metal alloy can be synthesized to provide desired melting temperature, electrical conductivity, and other properties. For example, Sn—Ag, Sn—Sb, Sn—Cu, and other alloys can be employed. Further, there can be employed suitable amorphous glassy metals, o other suitable metal composition.

With these considerations and examples, it is to be understood that some experimental verification may be required to confirm the co-drawing compatibility of various candidate materials. Once the drawing temperature of each material of interest is determined, and assuming that the materials can be drawn within a common temperature range, it can be prudent to examine the viscosities of the materials across the selected drawing temperature range to ensure that the viscosities are compatible. As stated above, it is not required that the viscosities of the various materials be the same at the fiber draw temperature, but rather that all materials should at least flow at the draw temperature, with conducting materials preferably molten at the draw temperature. Also, as stated previously, it is understood that it can be preferred that the material which comprises the majority of the volume of the fiber preform be characterized by the highest viscosity.

For example, a reasonable criteria for a material trio including a high glass-transition-temperature polymer, a chalcogenide semiconductor, and a metal is that all materials have viscosities lower than about $10^8$ Poise at the selected draw temperature, with metals preferably being molten at the selected draw temperature. If, e.g., the polymer material constitutes the majority of the fiber preform volume, then a polymer viscosity of between about $10^1$ Poise and about $10^8$ Poise can be acceptable, with a viscosity of between about $10^4$ Poise and about $10^7$ Poise preferred, all at the fiber draw temperature. In this example scenario, a viscosity of less than about $10^8$ can be acceptable for the semiconducting and conducting materials included in the fiber preform, with a viscosity of less than about $10^6$ preferred.

It is to be recognized that the fiber of the invention is not limited to a single conducting material selection, a single semiconducting material selection, or a single insulating material selection. Rather, any number of co-drawing compatible materials from the three material classes can be employed as necessary for a given fiber configuration and application. In addition, distinct material layers, regions, and elements can be included all of distinct thicknesses, dimensions, and composition. For example, various materials can be included to tailor optical signal transmission rates. In one such scenario, the inclusion of optical defect layers adjacent to optical transmission layers, and the tailoring of the thicknesses of such layers, can be employed to achieve a photonic propagation rate that is commensurate with the rate of electron propagation through other elements of a fiber.

Similarly, various conducting materials can be included with their dimensions tailored for a specific operation. For example, given a metal layer or strand incorporated into a fiber for electron conduction, the metal is preferably of sufficient thickness to achieve meaningful electrical conductivity for a given application, at reasonable applied voltage biases. The thickness of the metal is preferably selected based on a given application and the direction of required electronic conductivity. Recall that the resistance, R, in ohms, of a conductor is proportional to the conductor resistivity, $\rho$, length, l, and is inversely proportional to the conductor cross sectional area, A, as $R=\rho l/A$. Thus if an electrical potential difference is applied across a metal layer of the fiber in the radial direction, for radial conduction, a very thin metal layer can be sufficient to conduct large currents, while if conduction is to be in the axial direction, along the fiber length, then a metal layer as thick as 25 microns may be required for reasonable conduction along, e.g., a 10 m fiber section. In general, whatever conductor configuration is selected, it preferably is characterized by a resistance per unit length of less than about 1 $K\Omega/cm$ to enable effective electronic conduction. Various conducting material compositions and geometric combinations can be employed to tailor the conducting properties for a given application.

Assembly of materials into a fiber preform is carried out employing processes that are compatible with the selected materials to produce desired material configurations based on the considerations described above. No particular preform assembly technique is required by the invention. Rather, a range of techniques can be employed to produce a preform having a configuration corresponding directly to the desired post-draw fiber.

In accordance with the invention a variety of preform elements can be provided and/or produced separately for incorporation together into a preform arrangement. Considering first conductive materials, commercially available rods, strands, foils, sheets, and other articles of conducting material can be employed. Thermal evaporation, E-beam evaporation, sputtering, chemical vapor deposition (CVD) and other physical deposition techniques can be employed for coating preform elements with a conducting material layer or layers. It is to be recognized, however, that depending on a particularly selected deposition technique and the deposition parameters, not all deposited films may be compatible with a fiber co-drawing process; e.g., the deposited conducting material must be sufficiently thick as well as ductile to accommodate the drawing process.

Whatever conducting material geometry is employed, if the conducting material is a metal or metal alloy that will melt at fiber draw temperatures, then in accordance with the invention, the metal or alloy is arranged in the preform such that it is confined geometrically by materials in the preform that will not melt at the draw temperatures. This metal confinement ensures that the draw process retains the desired metal configuration in the fiber even while the metal is in a fluid state.

In addition, it is recognized in accordance with the invention that conducting materials can oxidize readily at elevated temperatures, including preform consolidation and fiber draw temperatures. Oxidized conducting materials may not melt or may flow nonuniformly, resulting in nonuniform or even inoperable conducting elements in the drawn fiber. To eliminate this condition, it can be preferred in accordance with the invention to inhibit and/or remove oxide from conducting element surfaces for various preform geometries.

The invention provides a range of techniques for inhibiting oxidized conducting materials in a drawn fiber. In a first example technique, an antioxidizing, or oxide inhibiting, agent that preferably is a surface wetting promoter is incorporated into the preform at interfaces surrounding the conducting material, e.g., surrounding metal elements in the preform. This can be achieved by, e.g., physically applying an oxidation inhibitor to the conducting material surfaces during the preform assembly. A particularly well-suited oxidation inhibitor is a flux; fluxes in general are synthetic carboxylic acid-containing fluids or natural rosin fluxes. These compounds serve to enhance and promote the wetting of the preform materials by the metal or other conducting material so as to prevent capillary breakup of the conducting material. This enables the use of conducting materials that may not normally exhibit the required surface wetting condition. Example suitable fluxes include Superior No. 312 flux, or Superior 340 flux, both from Superior Flux and Mfg. Co., Cleveland, Ohio. The flux can be applied directly to the conducting material surfaces, and can alternatively or in addition be applied to surfaces of other materials that in the preform configuration are to be adjacent to conducting material surfaces.

In a further technique for inhibiting oxidized conducting elements in a drawn fiber, an oxidation inhibitor can be applied to one or more preform elements by adding it to the elements. For example, an oxidation inhibitor can be added to a polymer material that is to be located adjacent to a conducting material element. The oxidation inhibitor constituent preferably segregates to or is naturally located at the surface of the polymer for application interaction with adjacent conducting materials. Alternatively, a polymer, semiconductor, or other material that itself has oxidation inhibition or oxide growth suppression properties can be selected for use in the preform adjacent to conducting elements. Oxidation inhibiting and/or growth suppression buffer layer materials can also be included between a conducting element and an adjacent material. Whatever oxidation inhibition technique is employed, it is preferred that the oxide inhibitor does not decompose at the preform consolidation temperature or the fiber draw temperature.

Considering the need to encapsulate metal preform elements and inhibit oxide of such elements, in one example for encapsulating metal strands, polymer-coated metal strands are produced from commercially-available metal wires. In one such scenario, Sn wires, e.g., 5 mm in diameter are coated with a layer of flux, such as that described above, and then wrapped with a layer of PES film, e.g., 7.5 mm-thick PES film commercially available, e.g., from Westlake Plastics Co., Lenni, Pa. Alternative wire coating techniques can be employed, such as dip coating. The ends of the wrapped wires are then coated with a polymer material, e.g., by dip-coating. For this application, a polymer solution, e.g., 20% PES, 80% N,N-Dimethylacetamide, can be employed. The polymer solution is then solidified on the wire by heating the structure, e.g., at 180° C., or by subsequent consolidation of the structure. Consolidation of the polymer-wrapped wires can be preferred for ensuring intimate contact between the metal and polymer materials, and can be carried out in a vacuum oven at, e.g., 260° C.

The heating step or consolidation process results in the polymer solution being solidified and the wires thereby encapsulated with a polymer layer. The polymer-wrapped wires can at this point be drawn to form metal strands of a desired diameter, if a reduced diameter is desired for a given application. For the example of PES-coated Sn wires, a draw temperature of about 305° C. in a vertical tube furnace produces polymer-coated metallic strands having an outer diameter between about 500 µm and about 1.5 mm, depending on draw conditions. The metallic strands can then be incorporated in a fiber preform arrangement in the manner described below. It is to be recognized, however, that if desired for some applications, as described below, metallic wires or other elements can be drawn to a desired diameter without encapsulating the elements in a polymer or other insulating material.

Considering insulating fiber preform elements, due to the relative ease of preform assembly and drawing of polymer materials, compared with other glassy insulating materials, polymeric insulating materials can be preferred for many fiber applications. Polymeric insulating materials can be readily obtained commercially or produced in a desired configuration. For example, commercially available polymer rods, tubes, sheets, and films from, e.g., Westlake Plastics Co., can be employed. Polymer rods and tubes can also be produced by thermal consolidation of a rolled polymer film. Polymer layers can be produced by chemical vapor deposition techniques such as plasma enhanced chemical vapor deposition, by spin-coating, dip-coating, as described above, by roll-casting, extrusion, and other techniques. Liquid polymer can be applied, as described above, for coating preform core materials, strands, wires, rods, layers of other material, and preform elements.

Chemical and physical deposition techniques can be employed for producing non-polymeric insulating material preform elements. The invention does not limit insulating materials to polymeric materials. So long as a candidate insulating material is characterized by a morphology that is compatible with fiber drawing, such can be employed in addition to or as an alternative to polymeric materials.

Similarly, chemical and physical deposition techniques can be employed for producing amorphous semiconducting material preform elements. As explained above, for many applications, chalcogenide glass semiconductors can be preferred for their co-drawing compatibility with polymeric insulators. Rods, tubes, sheets, films, and other semiconducting structures can be employed in the fiber preform. A wide range of semiconducting glass structures can be obtained commercially, e.g., from Alfa Aesar, Ward Hill, Mass., and also can be synthesized as a particularly desired composition and geometry.

For example, in accordance with the invention, chalcogenide glass structures can be chemically synthesized using sealed-ampoule melt quenching techniques. In one example scenario, pure elements such as As and Se are placed in a quartz tube under a nitrogen atmosphere. The tube is initially maintained open at one end. A vacuum line is connected to the open end of the tube and the tube is preheated under vacuum to melt the elements and remove trapped gasses and surface oxide. Heating to 330° C. for one hour at a heating ramp rate of about 1° C./min and thereafter cooling to room temperature at a ramp down rate of 1° C./min is sufficient. An oxygen gettering agent such as Mg can be added to the tube to reduce the partial pressure of oxygen within the tube.

The tube is then sealed under a vacuum of, e.g., $10^{-5}$ Torr, using, e.g., a high-temperature torch. The sealed tube is then heated in a rocking furnace for physically mixing the elements during a prescribed heating schedule corresponding to the elements included. For example, the As—Se mixture can be heated to 800° C. at a rate of about 2° C./min, while held vertical, for twenty four hours, and then rocked for six hours to increase mixing and homogenization. The glass liquid is then cooled, e.g., to 600° C., in the furnace, and then quenched in water. Subsequently, the mixture is annealed for one half hour to the glass transition temperature, e.g., about 180° C., before being cooled gradually to room temperature. Using this synthesis technique, mechanically strong semiconducting structures can be fabricated as, e.g., rods, tubes, and other structures. Once the glass is synthesized, it is no longer sensitive to oxygen at room temperature. It therefore can easily be handled in ambient atmosphere for incorporation into a preform or employed for further processing.

In addition to conducting, semiconducting, and insulating preform elements, sacrificial elements can be included in a preform to aid in defining a preform shape, and then removed prior to drawing of the preform into a fiber. For example, quartz tubes or rods can be included in a preform at locations for which a hole is desired, and then chemically etched away after consolidation of the preform. Similarly, Teflon™ rods or tubes can be included in a preform and mechanically removed from the preform after consolidation. This technique provides a particularly elegant method for defining gaps and spaces in a preform assembly prior to fiber drawing.

With preform building blocks like the examples described above, and with suitable fabrication processes, like those described above, a wide range of preform geometries can be assembled for enabling optical and electrical functionality, including transmission and device operation, in a final fiber structure. Semiconducting, insulating, or conducting rods, strands, and other geometric elements can be coated with selected material layers. Various material layers can be applied in any order, with the caveat that metals be geometrically confined by materials that will not melt at the draw temperature. Drilling, casting, injection molding, or other techniques can also be employed for defining the geometric relationship between material elements in a preform layer or region.

Considering now specific preform assemblies for producing fiber geometries like those corresponding to FIGS. 3A-3G, as described above, wires, strands, or rods of conducting material can be arranged in a preform. The conducting elements can be positioned on preform layers by employing, e.g., a liquid polymer solution that operates to "glue" the elements, particularly polymer-coated elements, to a layer or other element. Referring to FIGS. 3A-3C, individual strands or an array of strands can be positioned around an inner layer or other element by this technique. Given a PES insulating layer composition, a polymer solution of 20% PES, 80% N,N-dimethylacetamide, available from Alfa Aesar, as described above, can be employed as both an end-coating strand medium and the liquid attachment medium. As explained above, during a heating step or a thermal consolidation process, the liquid polymer solution solidifies to a solid PES region that is an integral part of the preform and fiber.

It is to be recognized that conducting strands, wires, rods, or other elements are not required to be covered with a polymer coating, but such can be a convenient technique for geometrically confining the conducting material within the preform assembly. Alternatively, uncoated conducting strands can be positioned around a layer, e.g., a polymer layer, with pieces of polymer film cut and fit between each strand, and a layer of polymer applied over the array of strands. Other materials can be employed for confining the metal so long as the materials cooperate with a desired fiber functionality and can geometrically confine the metal during a draw process.

For many applications, where a high glass-transition-temperature polymer is employed as an insulating material, it can be particularly advantageous to employ layers of polymer material in assembly of a preform structure. For example, for the photonic bandgap structure described previously, alternating layers of semiconducting and insulating materials can be produced by depositing a semiconductor layer on one or both sides of a polymer film and then rolling the film into a cylindrical multilayer structure. In addition, a polymer film can be rolled around individual preform elements, such as conducting strands, as described above, and further can be rolled around assemblies of elements like those shown in FIGS. 3A-3G to produce insulating fiber regions and outer layers.

Deposition of a semiconductor layer on one or both sides of a polymer film can be accomplished by thermal evaporation, chemical vapor deposition, sputtering, or other suitable deposition technique. Where a semiconductor such as a chalcogenide glass has been synthesized, e.g., by the chemical synthesis process described above, conventional thermal evaporation of a synthesized source material onto a polymer film can be a particularly convenient deposition technique. It is preferred that the polymer film be highly uniform in surface quality and thickness and be cleaned, e.g., with an alcohol, prior to the deposition process. Thermal evaporation can be carried out with conventional hot filament evaporation techniques, preferably at a pressure below, e.g., about $10^{-4}$ Torr. A conventional vacuum evaporator, e.g., a Ladd Research Industries Model 30000, can be employed. If desired, both sides of a polymer film can be coated with a selected material.

In order to assemble a layered preform structure of the polymer film and a material deposited on the film in the manner just described, the coated polymer film can be wrapped, or rolled, around a mandrel or other preform structure a number of times to produce a desired number of layers. For example, in production of a photonic bandgap structure for optical transmission, a PES film coated with $As_2Se_3$ can be rolled a number of times to produce a structure with 20 or more alternating semiconducting and insulating layers. In this scenario, the PES film and the $As_2Se_3$ layer thicknesses are selected specifically to achieve a maximal photonic bandgap at a desired wavelength of photon transmission. The desired thicknesses of the layers in the final fiber structure dictate the thicknesses of the materials in the preform, based on the selected draw conditions, as explained in detail below.

Where the photonic bandgap structure is to conduct photons through a central hollow core surrounded by the bandgap materials, the semiconductor-coated polymer film can be rolled around a sacrificial preform such as a glass rod, hollow glass tube, or Teflon™ rod or tube, or other structure that can be removed from the preform prior to the fiber drawing step. Where the coated polymer film is to be employed in an alternative configuration, the coated film can be rolled around other selected preform elements, e.g., polymer, semiconductor, or conducting rods, or other layers of preform materials, including metallic foils, semiconducting layers, or other preform elements. This enables the layered structures shown in FIGS. 3A-3G.

Also as shown in FIGS. 3A-3G, conducting elements can be configured in a preform directly adjacent to semiconducting elements, e.g., as electrodes 48 adjacent to a semiconducting core 46 shown in FIG. 3E. In one example preform assembly technique, the use of polymer films can be particularly advantageous for producing this structure. Considering a scenario in which a semiconductor core is to be contacted by metal electrodes, the semiconductor core can be obtained commercially or be chemically synthesized in the manner described above.

A PES or other polymer film is then provided, having any desired length, a width that corresponds to the length of the semiconductor rod, preferably slightly longer than the rod, and a desired thickness, e.g., 125 µm in thickness. It is preferred to clean the film, e.g., with alcohol, and bake the film, e.g., at 150° C. for 3 hours, to remove the alcohol.

The electrodes can be formed in conjunction with the polymer film using, e.g., tin foil, of a desired thickness, e.g., between about 25 µm and about 1 mm in thickness. Suitable foils can be commercially obtained, e.g., from Goodfellow Corporation, Devon, Pa., or can be produced by, e.g., pressing a metal rod to the desired foil thickness. The foil is preferably cleaned and dried in the manner of the polymer film. Additionally, it can be preferred to coat the foil with an oxide inhibitor, e.g., a flux, as described above.

The conducting electrodes are shaped by cutting the foil into desired electrode geometries. If, e.g., the electrodes are to be configured as rectangles extending along the fiber longitudinal axis, then rectangular tin foil pieces are correspondingly cut. It can be preferred to cut foil pieces that are slightly shorter than the semiconductor rod length to enable geometric confinement of the foil in the preform in the manner described below. The width of the foil pieces is set based on the particular functionality desired for the electrodes, e.g., a 5 mm-wide foil piece can be employed.

The foil pieces are assembled in a preform configuration by removing sections of the polymer film at film locations corresponding to the electrode geometry and the desired placement of the electrodes. The film sections can be removed through their entire thickness or a portion of the film thickness. Considering the placement of two electrodes equally spaced around a semiconductor rod, and given an electrode width, w, and the rod perimeter, $P=\pi d$, where d is the rod diameter, then the two electrodes are to be spaced a distance $(P-2w)/2$ apart on the film. Similar computations can be made to position any number of electrodes in a film to achieve a desired electrode configuration in a final fiber geometry. The foil electrodes are inserted into the film at the locations at which the film was removed, and if desired, an additional layer of film can be overlayed. The film-electrode assembly is then rolled around the rod or other element, taking care that the electrode foil material is contacting the rod.

If the polymer film is thinner than the metal foil or other conducting element, then it can be preferred to employ several layers of polymer film, with each of the layers having an appropriate amount of material removed at desired electrode locations. Alternative to the use of a polymer film, one or more polymer tubes or other structures can be employed for supporting electrode elements to be incorporated into a preform. For example, sections of a polymer tube can be removed for positioning foil pieces in the tube, with the tube then slid over a rod or other preform element. For many applications, the use of a polymer tube can be preferred for ease in positioning the metal electrodes and assembling the polymer-electrode configuration on another preform element.

Extended sections of foil or other conducting material can be applied to polymer films or other materials to be wrapped around preform elements in any geometry so long as confinement of conducting materials is achieved by the arrangement. For example, in the semiconductor-metal-insulator arrangement just described and shown in FIG. 3E, the electrodes 48 are radially confined between a semiconducting material 46 and an insulating material 49. In the example fiber of FIG. 3D, discrete conducting layer segments 84, 85, 86, 88, 89 are confined between adjacent material layers 87, 91, as well as material regions located between each conducting segment. Such confinement can be enabled by the polymer film-foil assembly described above, with regions of polymer film removed at desired conduction segment locations and metal foil inserted into the film regions.

Further, it was suggested just above that the electrode foil not extend the entire length of a polymer film to ensure that the polymer confines the foil at the longitudinal ends of the electrodes. If this is not the case, then it is preferred that an encapsulating material be applied at the preform ends. As described previously, a particularly convenient technique for such encapsulation can be the application of a liquid polymer solution that is dried during a subsequent heating or thermal consolidation step.

Beyond conducting elements, additional preform elements can be added and arranged. For example, as shown in FIG. 3E, additional material layers 50, 52, 54, possibly including strands or other elements 56, 57, 58, 66, 68, cores 62, or other elements, can be incorporated in the preform. As shown in FIG. 3F, this arrangement can be extended to produce a preform that includes multiple rods 62 in a selected configuration, e.g., having a selected number of adjacent electrodes 64. Layers of polymer film can be wrapped around each rod-electrode combination, and employing, e.g., a liquid polymer solution like that described above, can be attached together and to, e.g., a central polymer support structure.

Figure 3G:
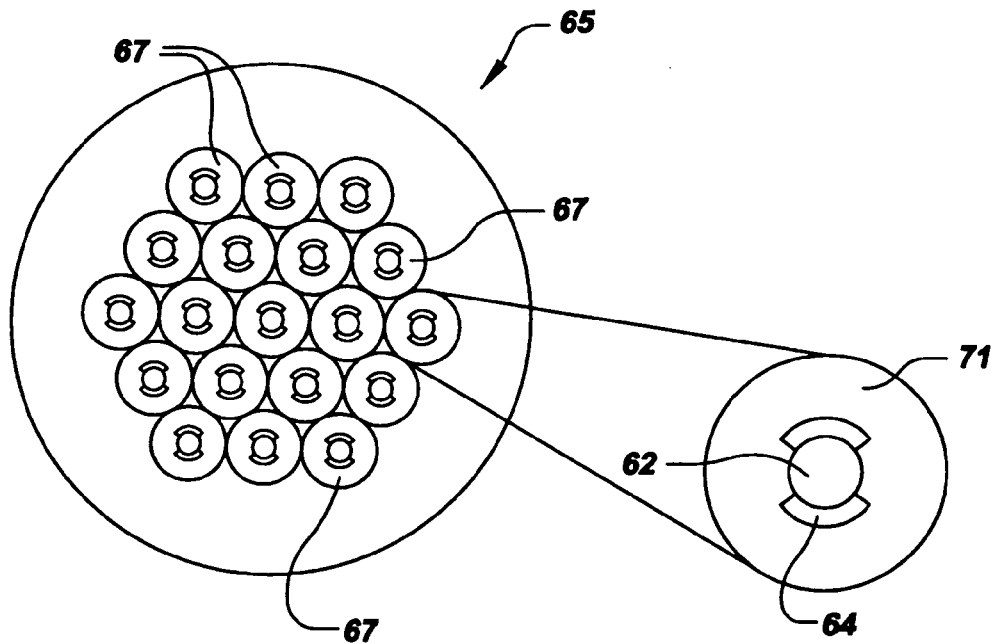

This preform assembly process can be extended to the arrangement of fiber elements in a preform for producing a hybrid fiber array like that shown in FIG. 3G. In this process provided by the invention, one or more preforms are assembled and drawn into one or more sub-fibers. The sub-fibers are then cut into fiber sections that are arranged in a desired array or other hybrid arrangement. This hybrid arrangement is then drawn into a hybrid fiber including the array elements.

Each of sub-fiber elements included in the hybrid fiber array can be produced in the manner described above, with various conducting, semiconducting, and insulating material elements arranged in a variety of selected preforms. The preforms are then drawn to sub-fibers, in the manner of the drawing processes described below. For the example fiber shown in FIG. 3G, a preform including a rod, e.g., a semiconducting rod, such as an $As_{22}Se_3$ rod, is arranged with metallic electrodes 64, e.g., Sn elements, provided adjacent to and in contact with the rod, with polymeric material 71, e.g., PBS, about the rod and electrodes. The process described above for assembling Sn foil into apertures cut in a polymer film can here be employed. With the preform complete, such is then drawn into a sub-fiber of e.g., about several meters in length and cut into a number of sub-fiber sections, e.g., 1000 sections, each section having a length of, e.g., 15 cm.

In assembly of a preform for the hybrid fiber, each of the cut sub-fiber sections is arranged, e.g., in an array. In one example technique for producing such an array, the sub-fiber sections are inserted inside a hollow sacrificial tube element, e.g., a quartz or Teflon™ tube. Because in this example each sub-fiber section includes electrodes that extend to the end of the sub-fiber section, it can be preferred dip the tube of sub-fibers into, e.g., a liquid polymer solution to coat the ends of the electrodes such that they will be geometrically confined when the hybrid fiber is drawn. The arrangement is then consolidated, in the manner described below, if necessary, and the sacrificial quartz tube removed or etched from the preform by, e.g., a liquid HF etch process. As a result of a consolidation process, the arrangement of sub-fiber sections are fused together as a unitary hybrid structure and the electrodes are coated with a polymer at the sub-fiber ends.

The hybrid preform structure can then be drawn into a hybrid fiber structure under the draw conditions described below. In the current example of sub-fiber elements, each sub-fiber section in the fiber array is, e.g., about 400 µm in diameter after its first drawing. The hybrid fiber drawing process further reduces the diameter of each sub-fiber; for example, given a drawdown reduction factor of 20, the diameter of each 400 µm-diameter sub-fiber section is reduced to 20 µm. Thus, as a result of the dual draw processes employed in this method, very minute fiber features are produced in each of the sub-fiber sections included in the hybrid fiber.

In addition to the preform assembly techniques described above, the invention contemplates drilling, casting, molding, and other techniques for producing a preform. For example, holes can be drilled in a polymer body and conducting or semiconducting strands or other elements fitted into the drilled regions. Any preform assembly technique that accommodates all of conducting, semiconducting and insulating materials in an arrangement that enables co-drawing of the three materials can be employed.

Depending on the selected preform assembly technique and resulting arrangement, it can be preferred to thermally consolidate an assembled preform prior to the fiber drawing process. Consolidation is a process whereby under heat and vacuum conditions one or more of the preform materials are caused to fuse together, with air pockets in the preform assembly being substantially eliminated. This results in a preform assembly that can produce intimate interfacial contact between adjacent material layers in the final fiber, and provides the preform with self-maintaining structural stability during the fiber draw process.

The specific conditions of the consolidation process are selected based on the particular materials incorporated into a given preform. If, e.g., a high glass-transition-temperature polymer is employed in the preform, then the consolidation temperature preferably is above the glass transition temperature of the polymer. The preform is maintained at the elevated temperature for a time sufficient to cause the polymer to fuse to adjacent elements included in the preform; the temperature is selected based on the preform diameter and its materials. Given a preform including PES polymer elements, $As_2Se_3$ semiconducting elements, and Sn metal elements, a consolidation temperature of between 250° C.-280° C., e.g., about 260° C., at a pressure of about $10^{-3}$, sufficiently consolidates the structure.

For most consolidation temperatures, metal preform elements will be melted during the consolidation process but confined to their intended geometries by the arrangement of confinement layers described above. Depending on the consolidation temperature, semiconducting preform elements may soften or may remain solid. The inclusion of at least one material that can fuse to adjacent materials during consolidation is all that is required. In the PES-$As_2Se_3$—Sn example given above, the consolidation temperature is set to enable softening and fusing of the PES polymer to adjacent preform elements.

It can be preferred to carry out the consolidation process in a vertical rotating zone refinement furnace. In such a furnace, the preform longitudinal axis is held vertically and a zone refining heating process is carried out along the preform length. Preferably the consolidation is conducted from the preform bottom upward through the preform to its top. The heating time for each incrementally consolidated preform section along the preform length is determined based on the preform diameter and material elements as explained above.

As explained above, in construction of a preform there can be included one or more sacrificial elements that are incorporated in the preform solely to define spaces to be provided in a final fiber geometry. For example, a mandrel, rod, or tube can be included in a preform where a hollow fiber core or other region is desired. If a sacrificial element is included in a preform, it is preferred that the consolidation process be carried out at a temperature below the glass transition temperature of that element, so that structural integrity of the sacrificial element is maintained during the consolidation process and the preform does not collapse on itself.

For many preform material arrangements, a sacrificial element can be constructed that can withstand reasonable consolidation temperatures and pressures and can easily be removed from the preform after consolidation. For example, Teflon™ tubes, rods, or other elements can be readily incorporated into and removed from a preform. Any material that exhibits poor surface adhesion and can withstand the consolidation process is a good sacrificial element material. It is preferable to remove the Teflon™ or other sacrificial element immediately after the consolidation process, while the preform is hot and slightly expanded. This enables ease of removal. Once the preform cools and correspondingly shrinks, it can be difficult, if not impossible, to remove the element by simple mechanical force.

Alternatively, sacrificial elements which can be removed from a consolidated preform by chemical etching can be employed. For example, glass, quartz, or other etchable materials that can withstand the consolidation process can be employed. In such a scenario, after the consolidation process, the preform is exposed to a chemical etchant that selectively attacks the sacrificial elements. For example, hydrofluoric acid or other acid bath can be employed for wet chemical etching of sacrificial elements. Dry etch techniques, e.g., plasma etch techniques, can also be employed if such can be adapted to contact and selectively attack the sacrificial materials in a preform.

Once a preform has been consolidated, if necessary, and sacrificial elements removed from the preform, drawing of the preform into a fiber can proceed. Fiber drawing can be carried out in a fiber draw tower or other suitable draw apparatus. In such an apparatus, a top preform downfeed mechanism is provided for holding an end of the preform and lowering the preform into a furnace. It can be preferred to employ a vertical draw furnace enabling three temperature zones, namely, top, middle, and bottom temperature zones. Below the furnace is provided a capstan with spooler for spooling the drawn fiber. Measurement equipment, e.g., a laser diameter monitor, from Beta LaserMike, Dayton, Ohio; fiber tension measurement devices, e.g., Model SM9649P, from Tension Measurement, Inc., of Arvada, Colo., and other monitoring equipment can be included.

The draw furnace temperature zones, preform downfeed speed, and capstan speed are selected based on the preform materials and configuration to enable co-drawing of preform conducting, semiconducting, and insulating material elements into a desired fiber configuration. The top furnace zone temperature is selected to cause the preform materials to soften but not flow. The middle furnace zone temperature is selected as the draw temperature, to cause the preform to flow into a fiber form. As explained above, the draw temperature is selected to be above the glass transition temperature of the insulating and semiconducting materials, and for most material combinations, will be above the melting temperature of the conducting material. If an excessively high draw temperature is employed, the preform will catastrophically deform, while an excessively low draw temperature will cause preform distortion and expansion. The structural arrangement of the preform must be preserved at the draw temperature.

It is therefore to be recognized that some experimental testing of draw temperatures can be required for a given preform assembly. As explained above, a reasonable criterion for polymer, metal, and chalcogenide material draw temperatures is that all materials have a viscosity lower than about $10^8$ Poise at the draw temperature and that the metal be molten at the draw temperature. Given a preform of PES polymeric insulating elements, $As_2Se_3$ semiconducting elements, and Sn conducting elements, a top zone temperature of between about 180° C.-250° C., e.g., 190° C.; a drawing zone temperature of between about 280° C.-315° C., e.g., 300° C.; and a bottom zone temperature that is unregulated, and therefore at, e.g., about 100° C., due to proximity to the draw zone, can be employed for successfully drawing the preform into a fiber.

For many applications, it can be preferred to ensure uniform heating of the preform during the drawing process. A uniformly heated furnace employing, e.g., distributed filament heating, is particularly well suited for the drawing process. It is further preferred that the preform be maintained laterally centrally in the drawing temperature zone. If the preform temperature distribution becomes nonuniform due to lack of furnace temperature control or lateral misalignment of the preform as it passes downward through the drawing zone, there could be produced local preform regions of differing temperature and differing viscosity. Local viscosity fluctuations in the preform could produce a capillary effect in which material, particularly molten metal, flows to other preform regions, and distorts the intended fiber geometry. The physical confinement of metal elements described above can be important for inhibiting such a condition, but in general, uniform preform heating is preferred for preserving an intended fiber geometry.

The combination of preform downfeed speed and capstan drawing speed determine the diameter of fiber produced by the drawing process for a given drawing temperature. A diameter monitoring system can be configured in a feedback loop to enable control of, e.g., the capstan speed, by the diameter monitors based on a diameter setpoint and control algorithm. For the drawing furnace zone temperatures recited above for drawing a PES-$As_2Se_3$—Sn preform of 20 cm in diameter and 30 mm in length, a downfeed speed of between about 0.002 mm/sec-0.004 mm/sec and a capstan speed of between about 0.7 m/sec-3 m/sec produces a fiber of a diameter between about 1200 μm and 500 μm and a length of several hundred meters. As can be recognized, a reduction in draw speed increases the resulting fiber diameter. Within the fiber, layers of the preform are reduced in thickness by a factor of ~20-100. In accordance with the invention, a preform can be drawn multiple times to reduce the final resulting fiber geometry correspondingly.

The drawdown ratio between a fiber preform and the resulting fiber is not precise; specifically, the preform layer thickness drawdown ratio does not always correspond precisely to the fiber's outer diameter drawdown ratio. This can be due to a number of factors, including, e.g., reduction of hollow core or other hollow spaces within the preform. The relationship between the layer and outer diameter drawdown ratios is found to be closer to 1:1 for large-diameter, low-tension draw procedures. High-temperature, low-tension draw procedures can tend to produce fibers having layers thicker than predicted by the outer diameter reduction ratio, due, e.g., to partial collapse of hollow regions. It is found, however, that such effects are fairly reproducible and can be predicted based on experimental history.

Upon completion of the fiber drawing operation, there is produced a fiber that can enable optical transmission, separate and independent electrical transmission, and optoelectronic device operation. The conducting and semiconducting fiber elements therefore are provided to be functional in at least one aspect of transmission or device operation and the insulating fiber elements can be provided for electrical and/or optical isolation as well as for functionality in at least one aspect of transmission or device operation.

It is to be recognized that while it can be preferred to employ conducting, semiconducting and insulating preform materials, the fiber that results from the draw process can exhibit altered material conductivities given the scale of feature sizes and cross-sectional element dimensions of the drawn fiber. For example, the conditions of the fiber drawing and/or the structural and dimensional changes that result from the drawing could render a semiconducting or metal preform material insulating, or an insulating preform material conducting. Further, the energy band structure of materials provided in a preform can be altered by the fiber drawing and/or resulting dimensional changes, and can change their conductivity correspondingly, given the scale of fiber feature sizes. In addition, it is recognized that one or more constituents can be incorporated into preform materials that adjust the materials' conductivity upon fiber drawing. For example, conducting filaments, such as carbon fibers, can be included in a preform material such as polymer whereupon drawing, the spacing between the fibers is reduced, leading to a change in polymer conductivity.

Figure 1B:
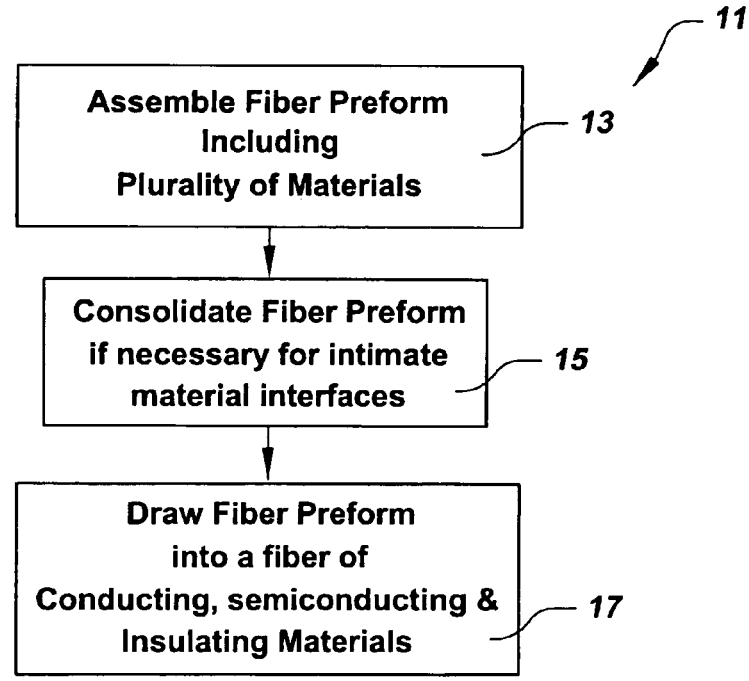

The invention contemplates employing these and other phenomena to produce a drawn fiber of conducting, semiconducting and insulating materials from a preform of materials that may not be conducting, semiconducting and insulating. A corresponding process flow 11 is described in the flow chart of FIG. 1B. In a first process step 13, a fiber preform is assembled to include a plurality of distinct materials. Then the assembled fiber preform is consolidated 15 if necessary for producing intimate interfaces as explained previously. Finally, the fiber preform is drawn 17 into a fiber of conducting, semiconducting, and insulating materials. In accordance with the invention, it is the conducting, semiconducting and insulating material properties of the drawn fiber that are to be achieved; and it is recognized that the preform need not provide a one-to-one correspondence in material conductivity with the fiber while still enabling this desired result. Shifts in the energy band structure of preform materials, dimensional, structural, and other changes in preform material constituents, and other such phenomena impacted by the fiber draw process can be employed to produce a conducting, semiconducting and insulating fiber geometry in accordance with the invention.

EXAMPLES

Figure 4:
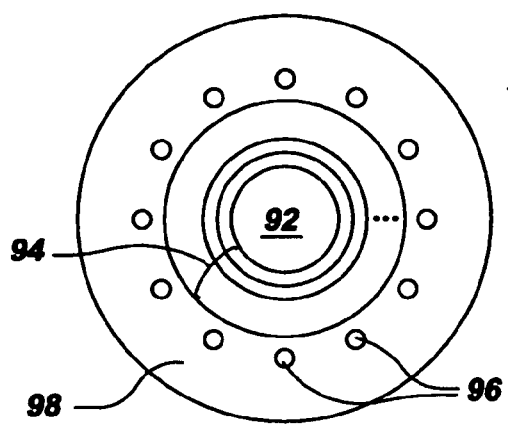
FIG. 4 is a schematic cross-sectional view of a fiber provided by the invention for optical and electrical transmission.

Referring to FIG. 4, a fiber 90 for conducting both photons and electrons was produced in accordance with the invention. A photon conducting region was provided as a hollow fiber core 92 around which was provided a multilayer photonic bandgap structure 94 of alternating semiconducting and insulating material layers. The bandgap structure exhibited a photonic bandgap at the wavelength corresponding to photon transmission. Sixty cylindrical strands 96 each having an Sn core and polymer cladding were provided around the bandgap structure, and additional polymer reinforcement material 98 was provided around the strands.

While this example bandgap structure is an omnidirectional reflecting mirror, fibers of the invention are not limited to such; the bandgap structure need not be a multilayer or 1D photonic bandgap structure and instead can exhibit a 2D or 3D photonic bandgap employing structures having periodicities in more than one direction. In the bandgap structure shown, the wavelengths at which photons are transmitted are controlled by the period length of the dielectric mirror of the structure. A change in the period length thereby changes the transmission wavelength.

The fiber preform for this geometry was assembled by wrapping a PEI film, coated on both sides with a layer of $As_2Se_3$, around a pyrex tube. Specifically, a 2.6 μm-thick layer of $As_2Se_3$ was evaporated onto both sides of a PEI film of 8 μm in thickness. The semiconducting material was chemically synthesized in the manner described previously. High purity As and Se elements were placed into a quartz tube under a nitrogen atmosphere. The tube was heated to 330° C. for one hour at a rate of 1° C./min under vacuum to remove surface oxide, $As_2O_3$, and then cooled to room temperature at 1° C./min. The tube was then sealed under vacuum of about $10^{-5}$ Torr. The resulting ampoule was heated to 700° C. at a rate of 2° C./min in a rocking furnace, held vertical for 10 hours, and then rocked for 12 hours to increase mixing and homogenization. The liquid was then cooled to 550° C., and quenched in air and water. It was then annealed for one half hour to about 180° C. and then gradually cooled to room temperature. The synthesized chalcogenide semiconductor was thermally evaporated onto both sides of the PEI film, the two semiconducting layers being ¼ the polymer film thickness.

The coated polymer film was then rolled around a pyrex tube having an outer diameter of 16 mm. The diameter of the tube was selected in concert with the polymeric insulator and semiconductor layer thicknesses, the required fiber inner core diameter, and the desired bandgap wavelength. A PEI layer was provided as the outermost layer of the material pair. Eight pairs of $As_2Se_3$/PEI layers were wrapped around the tube. Polymer-coated Sn strands were then produced in the manner described above. 5 mm diameter Sn wires were each wrapped with a layer of 7.5 mm-thick PEI film. The ends of the wrapped wires were coated with a polymer solution of 20% PES, 80% N,N-Dimethylacetamide.

Each of the polymer-coated metal strands was then attached to the PEI layer by applying a polymer solution of 20% PES, 80% N,N-dimethylacetamide on the PEI film and sticking the strands to the film. Additional layers of PEI film were then wrapped around the metal strands. The resulting preform was then consolidated at a temperature of 260° C. and a pressure of $10^{-3}$ Torr. After consolidation, the preform was immersed in a liquid HF bath or 3 hours to selectively etch away the pyrex tube.

With the sacrificial pyrex tube removed, the finalized preform was then drawn under conditions with a top zone temperature of 192° C., a draw temperature of 302° C., a downfeed speed of 0.003 mm/min and a capstan speed of 1 m/min. This resulted in the preform being drawn down to a fiber including an $As_2Se_3$ layer thickness of 150 nm, a PEI layer thickness of 280 nm, and a Sn metal wire diameter of about 8 µm.

Figure 5:
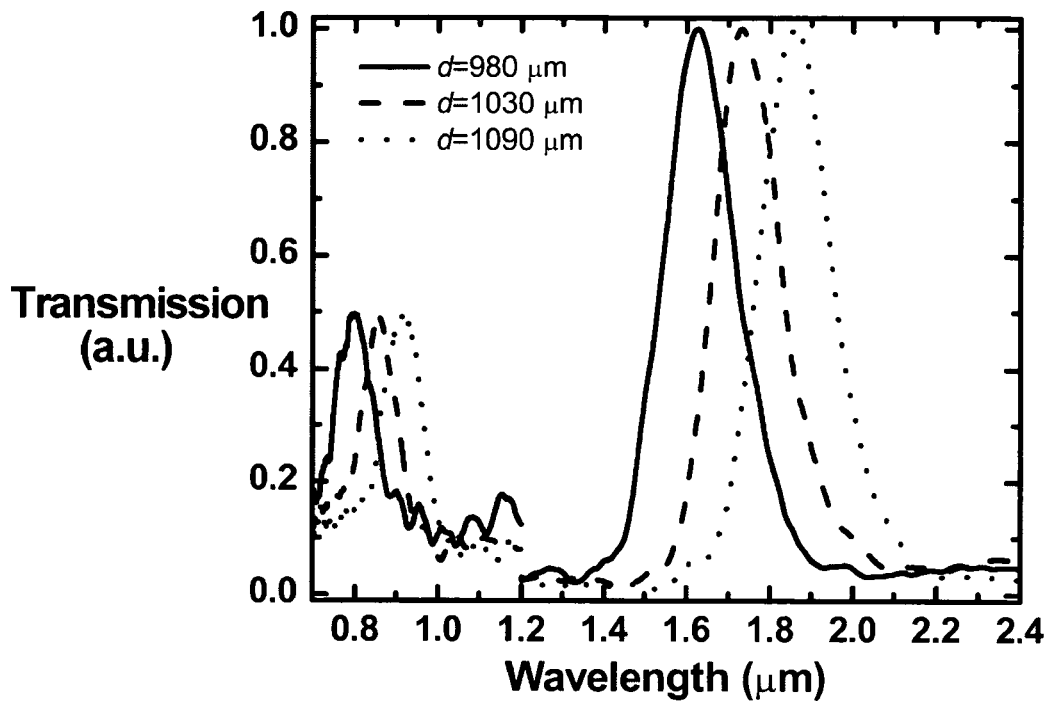
FIG. 5 is a plot of measured optical transmission as a function of transmitted wavelength for the fiber of FIG. 4.

FIG. 5 is a plot of experimentally measured optical transmission spectra of the dual electron-photon conducting fiber configuration of FIG. 4 for three different fiber outer diameters, namely, 980 µm, 1030 µm, and 1090 µm. Optical transmission measurements were performed using a Bruker Tensor 37 FTIR spectrometer with an InGaAs detector, in the near infrared region. Both ends of the fiber were coated with a thick layer of gold to ensure light coupling to the hollow core only, as well as to facilitate electrical conduction experiments. The fibers exhibited transmission peaks corresponding to the fundamental and second-order photonic bandgaps, which for the 980 µm-diameter fiber were located at 1.62 µm and 0.8 µm, respectively. As explained previously, the positions of the photonic bandgaps are determined by the lattice period of the layered mirror structure, which is in turn controlled by the final fiber diameter.

Figure 6:
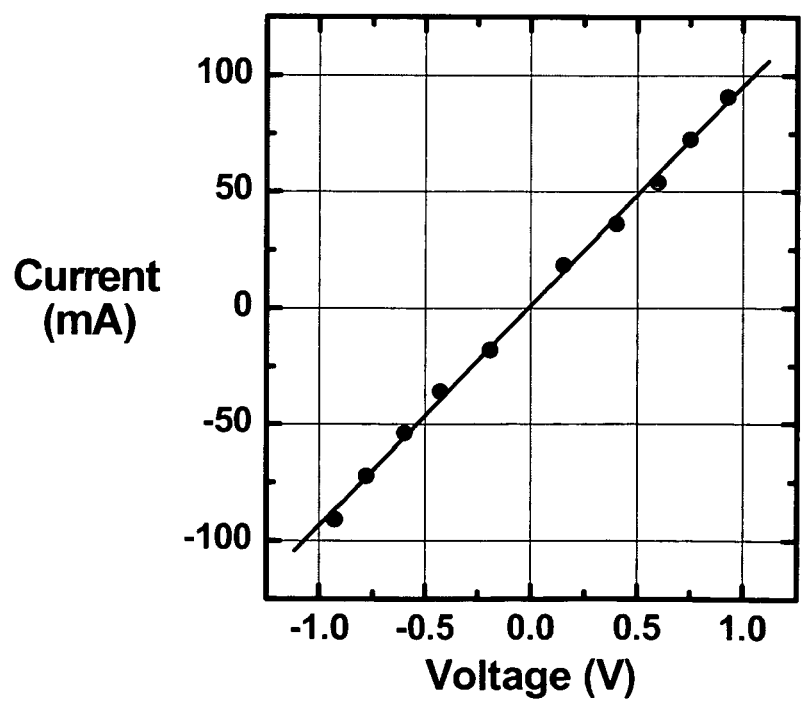
FIG. 6 is a plot of measured conducted electrical current as a function of applied voltage for the fiber of FIG. 4.

FIG. 6 is a plot of electrical current as a function of voltage applied across the metal strands of the fiber of FIG. 4. The electrical current of the strands was measured directly under the applied voltage. The electron transport properties of the fiber were found to be ohmic over the range of measurement. It was also found that electrical contact to the fiber could be achieved using conventional solder due to the high glass transition temperature of the PEI and PES polymers employed in the fiber structure.

Figure 7A:
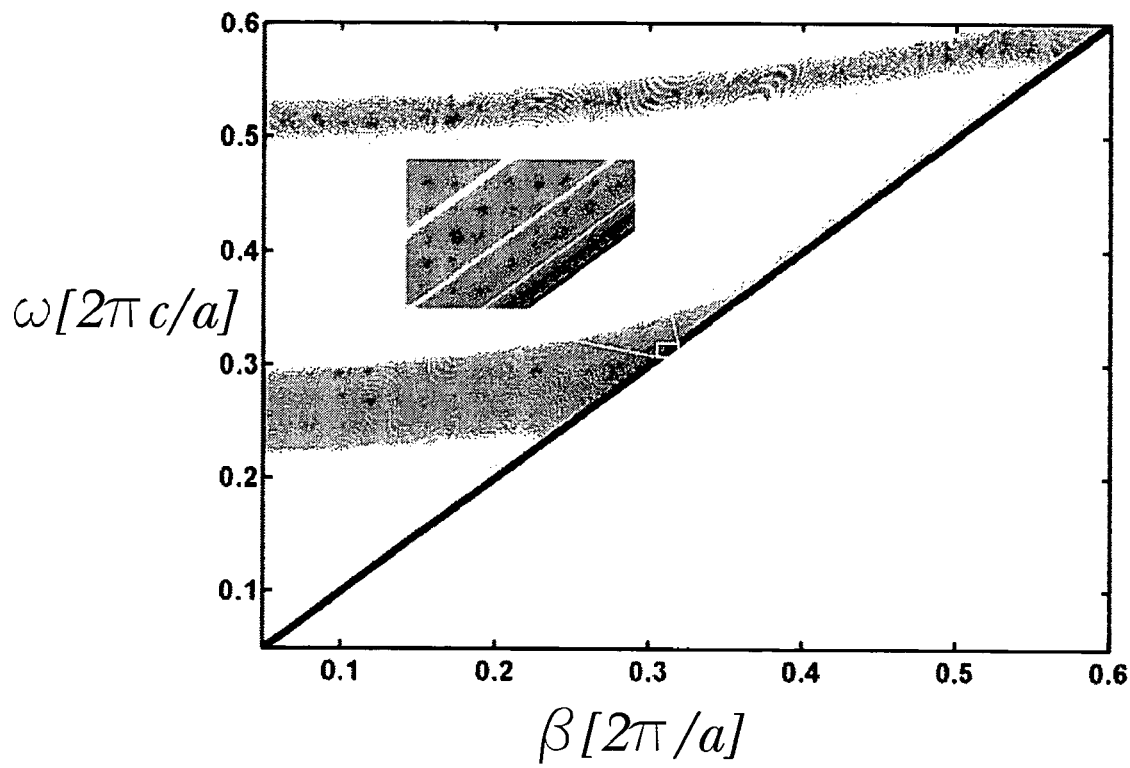
FIG. 7A is a plot of the calculated photonic band structure for the fiber of FIG. 4.

The photonic band structure and theoretical optical transmission of the fiber of FIG. 4 was predicted using a general expression for the radial outgoing flux from the cylindrical fibers. The plot of FIG. 7A represents the resulting band diagram. Darker shaded areas correspond to bandgap regions having decaying solutions for outgoing flux. Lighter shaded areas outside the bandgaps correspond to regions where light couples to radiating modes that are transmitted through the mirror structure and are therefore not localized for transmission within the hollow fiber core.

The optical transmission properties of these high overmoded fibers is set by the small intermodal separation, which is inversely proportional to the square of the fiber radius. Thus, a fiber core radius of 250λ, or 400 µm, is expected to have ~$10^5$ modes, making it difficult to observe the individual dispersion curves of the propagating modes in a full scale band structure. The inset image of the plot is a magnified segment of the guided modes near the light line, where the dispersion curves of the first three propagating fiber modes with angular momentum of 1 can be observed by the light colored stripes that indicate local minima in the outgoing flux, and therefore a strong confinement of the field within the hollow core.

Figure 7B:
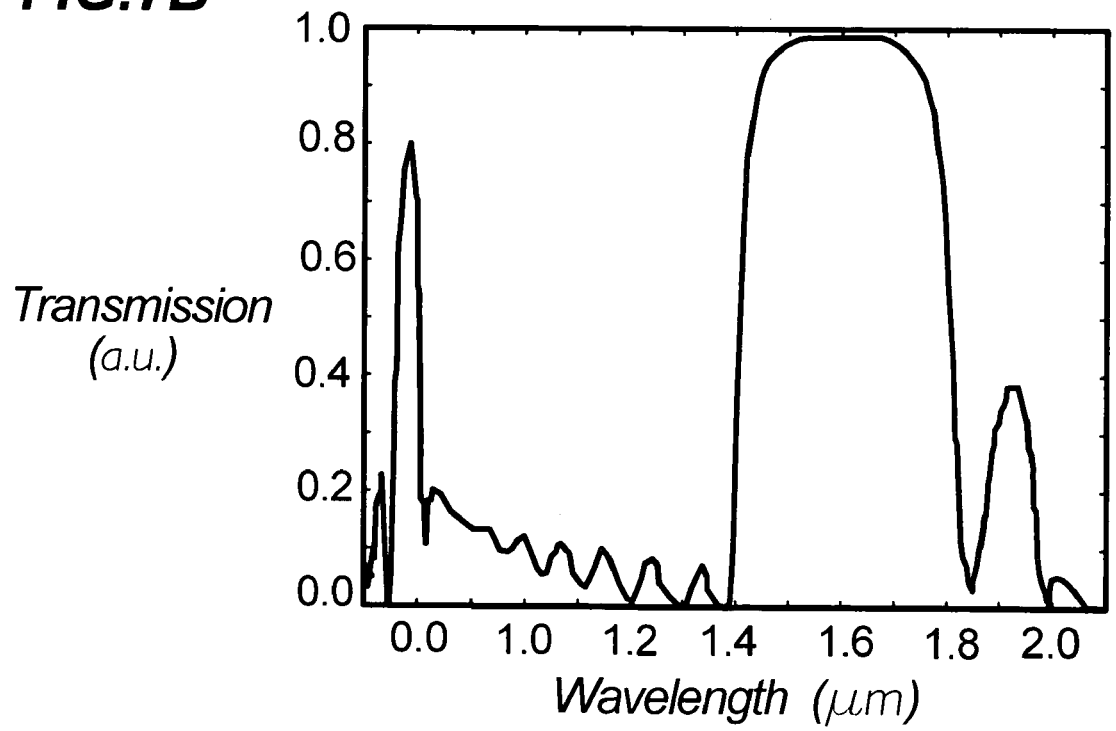
FIG. 7B is a plot of the calculated $HE_{11}$ mode transmission spectrum as a function of wavelength for the fiber of FIG. 4.

FIG. 7B is a plot of the calculated transmission spectrum for the fiber, based on the leaky mode technique. This calculated spectrum compares well with the measured spectra of the plot of FIG. 5, demonstrating high transmission at wavelengths corresponding to the first and second order photonic bandgaps.

Figure 8:
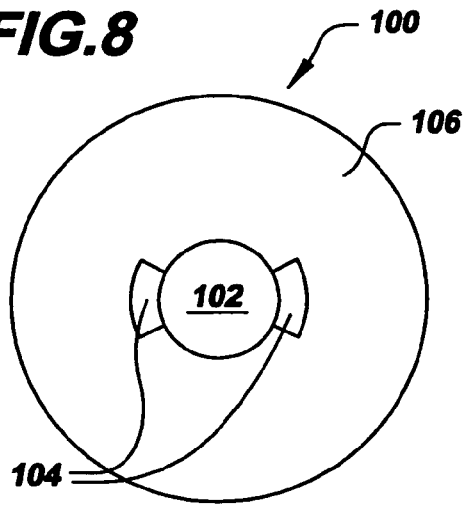
FIG. 8 is a schematic cross-sectional view of a fiber provided by the invention for photodetection.

Referring now to FIG. 8, a fiber was produced in accordance with the invention configured with a 500 µm diameter semiconducting core region 102 of $As_2Se_3$ chalcogenide glass directly contacted by two Sn metal electrodes 104 of 65 µm in radial thickness and 180 µm in circumferential length, along the longitudinal length of the fiber. A layer of PES was provided around the metal electrodes.

The fiber preform was produced in the manner described previously, with the $As_2Se_3$ chalcogenide glass core chemically synthesized. The metal electrodes were formed of Sn foil cut into rectangles and inserted into regions cut into a PES film. The Sn-PES structure was then wrapped around the glass core, and additional PES layers were wrapped around the assembly.

The preform was consolidated at a pressure of $10^{-3}$ Torr and a temperature of 260° C. The preform was then drawn under conditions with a top zone temperature of between 190° C.-230° C. and a draw zone temperature of between 290° C. and 295° C. A downfeed speed of 0.003 mm/min and a capstan speed of 1 m/min were employed.

Under experimental testing, the electrical resistance of the fiber was found to decrease dramatically upon illumination, due to the photo-induced generation of electron-hole pairs at the surface of the semiconducting core 102. This demonstration verified the operation of fiber as a photodetector device. Once such charges are generated, they are separated by an electric field produced by a voltage applied between the metal electrodes and are swept towards opposing electrodes.

Figure 9A:
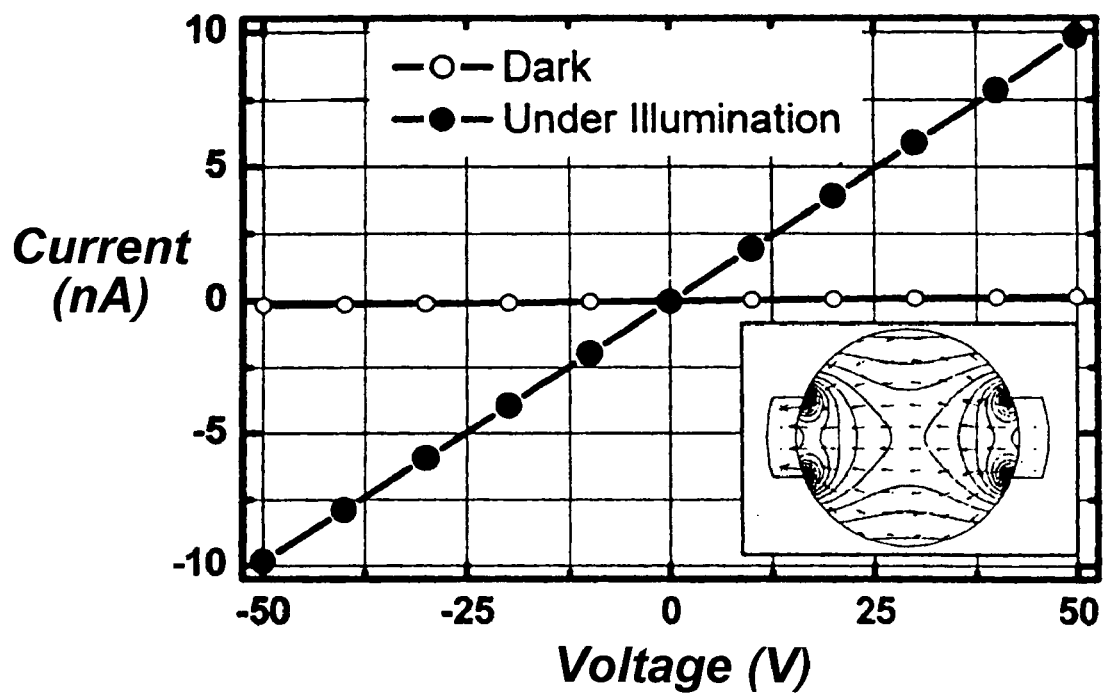
FIG. 9A is a plot of the measured current-voltage characteristics of the fiber of FIG. 8.

FIG. 9A is a plot of the photo-response of the photodetector fiber. This photo-response was measured using a Yokagawa pico-ampere meter and a Hewlett Packard 4140B DC voltage source. The fiber was illuminated using white light from a quartz-tungsten-halogen lamp, which was measured to produce a conductivity enhancement of up to two orders of magnitude. The linear behavior of the I-V plot of FIG. 9A is indicative of ohmic behavior in the structure; no Schottky effects at the metal-semiconductor junction were observed over the range of measurement. It is to be noted that the photodetector fiber could alternatively be operated in a capacitive rather than resistive detection mode.

Figure 9B:
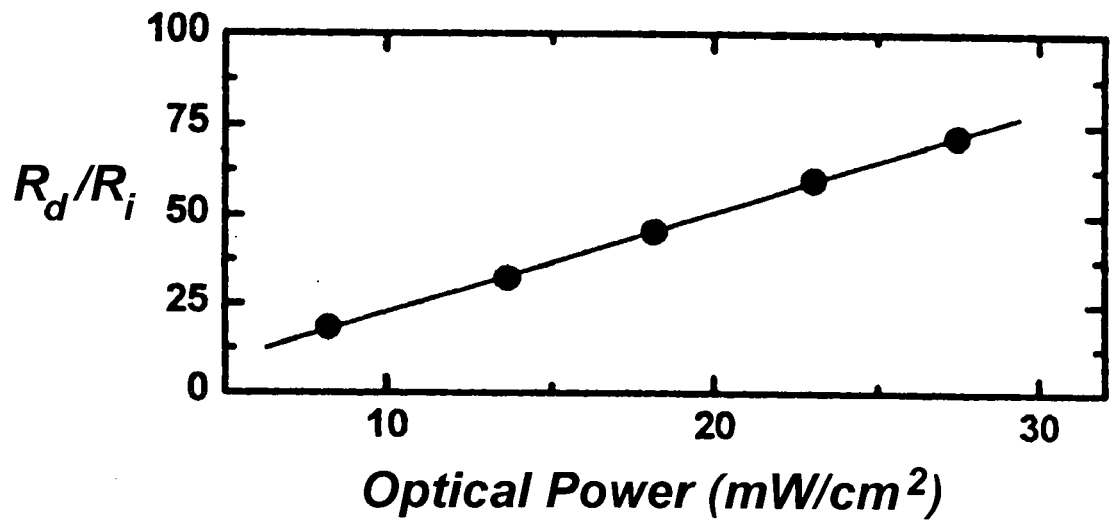
FIG. 9B is a plot of measured fiber resistance as a function of illumination intensity for the fiber of FIG. 8.

FIG. 9B is a plot the dependence of photodetector fiber's conductivity on optical illumination intensity, which was found to be linear over the range of measurement. The electric field lines produced by the applied voltage were simulated using finite element techniques and are shown in the inset of FIG. 9A.

The photodetector fiber response is reminiscent of a metal-semiconductor-metal photodetector (DMSM), and provides particular advantages over that structure. In particular, the invention enables adaptation of the photodetector fiber for a range of applications. For example, the hybrid fiber array of FIG. 3G can be configured as an array of photodetector fibers. Other configurations can also be arranged to enhance and/or exploit the photoresponse of the photodetector fiber.

Figure 10A:
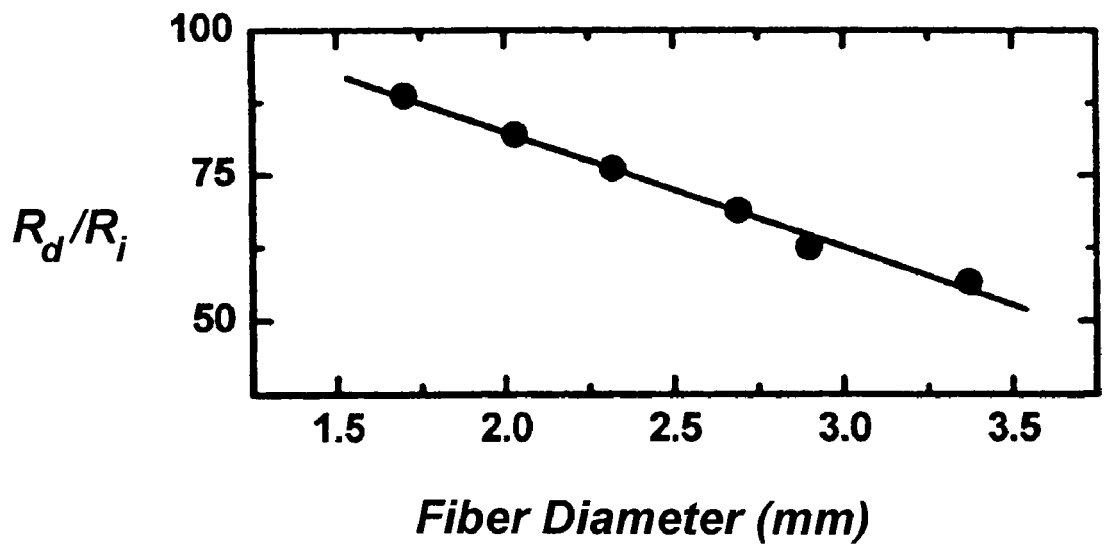
FIG. 10A is a plot of measured fiber resistance as a function of fiber diameter for a given fiber illumination, for the fiber of FIG. 8.

The photosensitivity of the photodetector fiber was found to scale inversely with its diameter, and thus fibers with smaller element diameters are understood to exhibit increased photosensitivity. FIG. 10A is a plot of photodetector fiber resistance, $R_l$, as a function of fiber diameter. It can be shown from simple scaling arguments that a reduction in fiber dimensions will not change the dark resistance, $R_d$. However, upon illumination, a conducting layer is formed along the circumference of the fiber having a thickness which is determined solely by the penetration depth of the illuminated light, which is independent of diameter. The resistance of this layer scales linearly with its length, which in turn is proportional to the fiber diameter, resulting in the observed linear dependence of the illuminated fiber's resistance diameter.

Figure 10B:
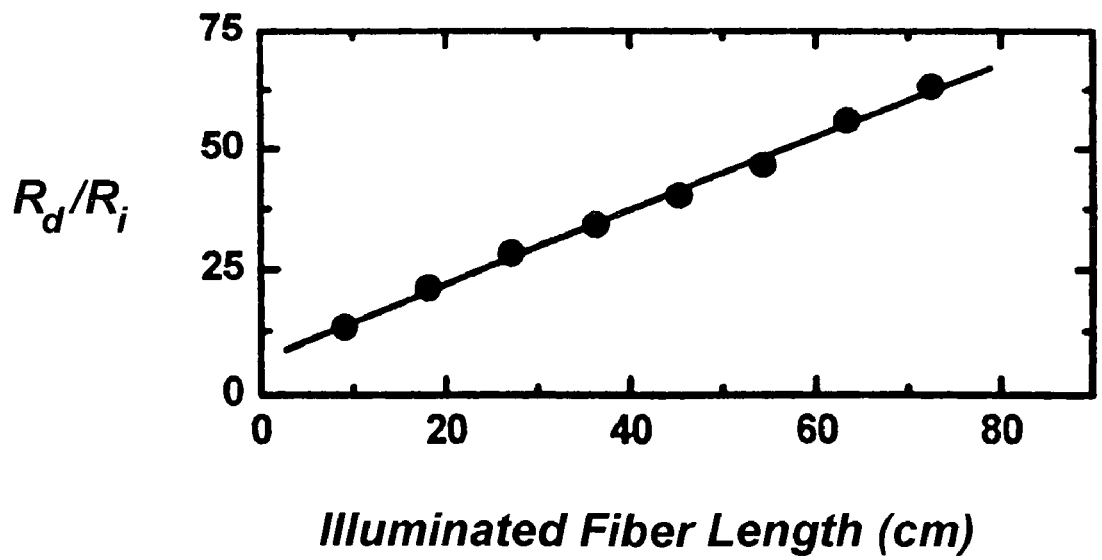
FIG. 10B is a plot of measured fiber resistance as a function of illuminated fiber length for a given fiber illumination, for the fiber of FIG. 8.

It was found that the photodetector fiber's photogenerated current also depends on the length of the illuminated portion of the fiber. FIG. 10B is a plot of resistance as a function of illuminated fiber length. This result demonstrates that the photodetector fiber exhibits truly distributed characteristics. The photodetection functionality is continuous along the photodetector fiber length, in contrast to conventional photodetecting elements that typically are point-like objects limited the micron scale. The electronic mobility edge of $As_2Se_3$ glass corresponds to a wavelength of 650 nm, making this fiber configuration an efficient photo-detector over the visible range as well as near IR range. This detection range could be readily expanded through selective compositional changes to the core glass.

The ability to combine precise dimensional and geometrical control, achieve small feature sizes and maintain axial uniformity along extended lengths of fiber while at the same time facilitating intimate contact and adhesion between conducting, semiconducting and insulating materials paves the way for a broad range of functional fibers for electronic and photonic applications. It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A fiber comprising a conducting material, an insulating material, and a semiconducting material, each of the materials being characterized by a viscosity that is less than about $10^6$ Poise, while maintaining structural material integrity, at a common fiber draw temperature.

2. The fiber of claim 1 wherein the materials are disposed in a configuration of preselected optical and electronic functional elements.

3. The fiber of claim 1 wherein the materials are disposed in an all-solid fiber cross section.

4. The fiber of claim 1 wherein the materials comprise fiber elements that do not share a characteristic symmetry of a fiber outer perimeter.

5. The fiber of claim 1 wherein the materials comprise fiber elements that do not share a characteristic symmetry of a fiber inner perimeter.

6. The fiber of claim 1 wherein at least one of the conducting, insulating, and semiconducting materials comprises at least one fiber element having a perimeter that is a closed loop which does not contain a characteristic center of a cross section of the fiber.

7. The fiber of claim 1 wherein the fiber includes a fiber cross section that is characterized by cylindrical asymmetry.

8. The fiber of claim 1 characterized by a length that is greater than about 10 meters.

9. The fiber of claim 8 characterized by a length that is greater than about 20 meters.

10. The fiber of claim 9 characterized by a length that is greater than about 50 meters.

11. The fiber of claim 10 characterized by a length that is greater than about 100 meters.

12. The fiber of claim 1 wherein the insulating material comprises a polymeric insulating material.

13. The fiber of claim 12 wherein the polymeric insulating material comprises a high glass-transition-temperature material.

14. The fiber of claim 12 wherein the polymeric insulating material comprises poly-ether imide.

15. The fiber of claim 12 wherein the polymeric insulating material comprises poly-ether sulfone.

16. The fiber of claim 12 wherein the polymeric insulating material comprises poly-methyl methacrylate.

17. The fiber of claim 12 wherein the polymeric insulating material comprises a polymeric rod.

18. The fiber of claim 12 wherein the polymeric insulating material comprises a polymeric tube.

19. The fiber of claim 12 wherein the polymeric insulating material comprises a polymeric layer.

20. The fiber of claim 12 wherein the polymeric insulating material comprises poly-sulfone.

21. The fiber of claim 1 wherein the conducting material comprises a metal.

22. The fiber of claim 21 wherein the metal comprises Sn.

23. The fiber of claim 21 wherein the metal comprises at least one metal strand.

24. The fiber of claim 21 wherein the metal comprises a metal layer.

25. The fiber of claim 1 wherein the conducting material comprises a metal alloy.

26. The fiber of claim 1 wherein the semiconducting material comprises a chalcogenide glass material.

27. The fiber of claim 26 wherein the semiconducting material comprises $(As_{40}Se_{60})_{1-x}Sn_x$.

28. The fiber of claim 26 wherein the chalcogenide glass comprises $As_2Se_3$.

29. The fiber of claim 1 wherein the semiconducting material comprises a semiconducting rod.

30. The fiber of claim 1 wherein the semiconducting material comprises a semiconducting layer.

31. The fiber of claim 1 wherein the semiconductor material comprises a glassy inorganic semiconducting material.

32. The fiber of claim 31 wherein the semiconducting material has a characteristic glass transition temperature.

33. The fiber of claim 1 wherein one of the conducting, insulating, and semiconducting materials is further characterized by a viscosity that is greater than about $10^4$ Poise.

34. The fiber of claim 1 wherein a one of the conducting, insulating, and semiconducting materials that constitutes a majority volume of material of the fiber is further characterized by a viscosity that is greater than about $10^4$ Poise.

35. A fiber comprising:
a conducting material;
an insulating material; and
a semiconducting material;
the conducting, insulating, and semiconducting materials being disposed in a geometric relationship corresponding to a drawing preform of the fiber.

36. The fiber of claim 35 wherein the conducting material comprises electrodes, disposed at fiber cross section locations, that can sustain an applied voltage bias between the electrodes.

37. The fiber of claim 35 wherein the insulating material comprises a polymeric insulating material.

38. The fiber of claim 35 wherein the insulating material comprises an optical transmission element.

39. The fiber of claim 35 wherein the insulating material comprises an optoelectronic device element adjacent to and in contact with an electrically conducting element.

40. The fiber of claim 35 wherein the conducting material comprises a metal.

41. The fiber of claim 35 wherein the conducting material comprises a metal alloy.

42. The fiber of claim 35 wherein the conducting material comprises an electrical transmission element.

43. The fiber of claim 35 wherein the conducting material comprises an optoelectronic device element adjacent to and in contact with a semiconducting element.

44. The fiber of claim 35 wherein the semiconducting material comprises a semiconducting chalcogenide glass.

45. The fiber of claim 35 wherein the semiconducting material comprises an optical transmission element.

46. The fiber of claim 35 wherein the semiconducting material is characterized by an amorphous material morphology that is a continuous atomic network having substantially no crystalline order.

47. A fiber comprising a conducting material, an insulating material, and a semiconducting material, each of the materials being characterized by a viscosity that is less than about $10^6$ Poise, while maintaining material properties, at a common fiber draw temperature.

48. A fiber drawing preform comprising:
a conducting material;
an insulating material; and
semiconducting material;
the conducting, insulating, and semiconducting materials being disposed in a preform assembly geometry arranged for drawing into a corresponding fiber of the conducting, semiconducting, and insulating materials.

49. A fiber drawing preform comprising:
a conducting material;
an insulating material; and
a semiconducting material;
the conducting, insulating, and semiconducting materials being disposed in a preform assembly geometry corresponding to a drawn fiber geometry of the conducting, semiconducting, and insulating materials.

50. The fiber drawing preform of claim 49 wherein the drawn fiber is characterized by a fiber length that is at least about 100 times greater than a characteristic preform length.

51. The fiber drawing preform of claim 49 wherein the drawn fiber is characterized by a fiber diameter that is at least about 10 times less than a characteristic preform diameter.

\* \* \* \* \*

UNITED STATES PATENT AND TRADEMARK OFFICE
CERTIFICATE OF CORRECTION

| | | |
|---|---|---|
| PATENT NO. | : 7,295,734 B2 | Page 1 of 1 |
| APPLICATION NO. | : 10/890948 | |
| DATED | : November 13, 2007 | |
| INVENTOR(S) | : Mehmet Bayindir | |

It is certified that error appears in the above-identified patent and that said Letters Patent is hereby corrected as shown below:

Please delete the paragraph titled 'STATEMENT REGARDING FEDERALLY SPONSORED RESEARCH' encompassing Column 1, lines 14-21:

"This invention was made with Government support under Contract No. DAAD19-01-0647, awarded by DARPA, under Contract No. ECS-0123460, awarded by the NSF, under Contract No. DMR 02-13282 awarded by the NSF, under contract N00014-02-1-0717 awarded by ONR, under Contract No. Y77011 awarded by AFOSR, and under Contract No. DE-FG02-99ER45778 awarded by DOE. The Government has certain rights in the invention."

and replace with:

-- This invention was made with government support under Grant No. DAAD19-01-1-0647 awarded by the Army Research Office, and under Grant Nos. DMR0213282 and ECS0123460 awarded by the National Science Foundation. The government has certain rights in this invention. --

Signed and Sealed this
Sixteenth Day of October, 2012

David J. Kappos
*Director of the United States Patent and Trademark Office*